(12) United States Patent
Nakauchi

(10) Patent No.: US 11,158,774 B2
(45) Date of Patent: Oct. 26, 2021

(54) LIGHT-EMITTING DEVICE, LIGHT-EMITTING MODULE, AND METHOD OF MANUFACTURING LIGHT-EMITTING DEVICE

(71) Applicant: NICHIA CORPORATION, Anan (JP)

(72) Inventor: Takao Nakauchi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 130 days.

(21) Appl. No.: 16/714,693

(22) Filed: Dec. 14, 2019

(65) Prior Publication Data

US 2020/0194642 A1  Jun. 18, 2020

(30) Foreign Application Priority Data

Dec. 14, 2018 (JP) .............................. JP2018-234960
Dec. 6, 2019 (JP) .............................. JP2019-221625

(51) Int. Cl.
*H01L 33/60* (2010.01)
*F21V 8/00* (2006.01)
(Continued)

(52) U.S. Cl.
CPC ............ *H01L 33/60* (2013.01); *G02B 6/0016* (2013.01); *G02B 6/0021* (2013.01);
(Continued)

(58) Field of Classification Search
CPC ... H01L 33/60; H01L 33/505; H01L 25/0753; G02B 6/0016; G02B 6/0021; G02B 6/0023; G02B 6/0031
See application file for complete search history.

(56) References Cited

U.S. PATENT DOCUMENTS

2013/0285091 A1  10/2013  Akimoto et al.
2013/0299864 A1  11/2013  Sugizaki et al.
(Continued)

FOREIGN PATENT DOCUMENTS

CN  107134522 A  9/2017
JP  2012146898 A  8/2012
(Continued)

*Primary Examiner* — Mary Ellen Bowman
(74) *Attorney, Agent, or Firm* — Hunton Andrews Kurth LLP

(57) ABSTRACT

A light-emitting device includes a light-emitting element including first and second main surface, and a first lateral surface; a wavelength conversion member including a third main surface, a fourth main surface, and second lateral surfaces; a light-transmissive adhesive member; and a first light-reflective member containing a light-reflective first filler, covering the first lateral surface provided with the light-transmissive adhesive member, and including third lateral surfaces being peripheral surfaces of the first light-reflective member. In a cross-section in a direction perpendicular to the second main surface, a distance between the third lateral surfaces is smaller than a distance between the second lateral surfaces at a fourth main surface side. Each of the second lateral surfaces of the wavelength conversion member includes a first inclined surface in a region adjacent to the third main surface. The wavelength conversion member includes light-reflective particles located on the first inclined surface.

19 Claims, 11 Drawing Sheets

(51) Int. Cl.
*H01L 33/50* (2010.01)
*H01L 25/075* (2006.01)

(52) U.S. Cl.
CPC ......... *G02B 6/0023* (2013.01); *G02B 6/0031* (2013.01); *H01L 25/0753* (2013.01); *H01L 33/505* (2013.01)

(56) References Cited

U.S. PATENT DOCUMENTS

| | | |
|---|---|---|
| 2013/0320381 A1 | 12/2013 | Kojima et al. |
| 2015/0115298 A1 | 4/2015 | Tomizawa et al. |
| 2016/0020365 A1 | 1/2016 | Brandl et al. |
| 2016/0240746 A1* | 8/2016 | Yun .................. H01L 33/56 |
| 2017/0117446 A1 | 4/2017 | Tsuchiya et al. |
| 2021/0063818 A1* | 3/2021 | Yamashita ........ G02F 1/133607 |

FOREIGN PATENT DOCUMENTS

| | | | |
|---|---|---|---|
| JP | 2012204614 A | 10/2012 | |
| JP | 2013232539 A | 11/2013 | |
| JP | 2015088524 A | 5/2015 | |
| JP | 2016510177 A | 4/2016 | |
| JP | 2017079311 A | 4/2017 | |
| JP | 2018093197 A | 6/2018 | |

\* cited by examiner

LIGHT-EMITTING DEVICE, LIGHT-EMITTING MODULE, AND METHOD OF MANUFACTURING LIGHT-EMITTING DEVICE

CROSS-REFERENCE TO RELATED APPLICATIONS

This application claims priority to Japanese Patent Application No. 2018-234,960, filed on Dec. 14, 2018, and Japanese Patent Application No. 2019-221,625, filed on Dec. 6, 2019, the contents of which are hereby incorporated by reference in their entirety.

BACKGROUND OF THE INVENTION

1. Field of the Invention

The present disclosure relates to a light-emitting device employing a light-emitting element, a light-emitting module, and a method of manufacturing a light-emitting device.

2. Description of Related Art

Light-emitting devices including light-emitting elements such as light-emitting diodes (LEDs) are widely used for backlight devices for liquid-crystal display devices and light sources for display devices and the like.

For example, a light source device described in Japanese Unexamined Patent Application Publication No. 2012-204614 includes a plurality of light-emitting elements mounted on a mounting substrate, phosphor layers each provided on a respective one of the light-emitting elements, and reflective layers each disposed on surfaces of a respective one of the phosphor layers.

According to recent demands for reduction in size and weight, further reduction in size and thickness and further increase in luminance of such a light-emitting device is required. In particular, improvement in the extraction efficiency of light emitted from a light-emitting element is required.

SUMMARY OF THE INVENTION

One object of certain embodiments of the present invention is to provide a light-emitting device with higher light extraction efficiency, a light-emitting module, a method of manufacturing the light-emitting device, and a method of manufacturing the light-emitting module.

A light-emitting device according to certain embodiments of the present invention includes a light-emitting element including a first main surface provided with an electrode, a second main surface opposite to the first main surface, and a first lateral surface connected with the first main surface and the second main surface; a wavelength conversion member including a rectangular third main surface having an area larger than an area of the second main surface and bonded to the second main surface, a fourth main surface opposite to the third main surface, and second lateral surfaces connected with the third main surface and the fourth main surface, the wavelength conversion member adapted to convert light emitted from the light-emitting element into light with a different wavelength; a light-transmissive adhesive member continuously covering a portion of the first lateral surface at a second main surface side and a portion of the third main surface; and a first light-reflective member covering the first lateral surface provided with the light-transmissive adhesive member, the first light-reflective member including third lateral surfaces that are peripheral surfaces of the first light-reflective member. The first light-reflective member contains a light-reflective first filler. In a cross-section of the light-emitting device in a direction perpendicular to the second main surface, a distance between the third lateral surfaces of the first light-reflective member is smaller than a distance between the second lateral surfaces at a fourth main surface side. Each of the second lateral surfaces of the wavelength conversion member includes a first inclined surface in a region adjacent to the third main surface. The wavelength conversion member includes light-reflective particles located on the first inclined surface.

A method of manufacturing a light-emitting device, the device including a light-emitting element, a wavelength conversion member, a light-transmissive adhesive member, and a first light-reflective member, according to another embodiment of the present invention includes: providing a first resin layer that is the wavelength conversion member, a plurality of light-emitting elements, and a second resin layer that is the first light-reflective member, such that the first resin layer contains a first resin and a phosphor mixed in the first resin, the plurality of light-emitting elements are spaced apart from each other on an upper surface of the first resin layer, and the second resin layer is disposed between adjacent ones of the plurality of light-emitting elements and contains a light-reflective first filler; forming a first cutting region by cutting the second resin layer at a certain interval using a first blade having a first thickness; forming a second cutting region by inserting a second blade having a second thickness smaller than the first thickness into the first cutting region and by cutting the first resin layer directly below the first cutting region, to perform separation into individual light-emitting devices and to form a first inclined surface in a second lateral surface, which is a lateral surface of the wavelength conversion member, in each of lateral surfaces of each of the individual light-emitting devices, such that the first inclined surface is inclined with respect to a plane of the second lateral surface and is formed adjacent to a region bonded to the first light-reflective member, and adhering light-reflective particles to the first inclined surface.

A method of manufacturing a light-emitting device, the device including a light-emitting element, a wavelength conversion member, a light-transmissive adhesive member, and a first light-reflective member according to still another embodiment of the present invention, includes: providing a first resin layer that is the wavelength conversion member, a plurality of light-emitting elements, and a second layer that is the first light-reflective member, such that the first resin layer contains a first resin and a phosphor mixed in the first resin, the plurality of light-emitting elements are spaced apart from each other on an upper surface of the first resin layer, and the second resin layer is disposed between adjacent ones of the plurality of light-emitting elements and contains a light-reflective first filler; forming a first cutting region by cutting the second resin layer at a certain interval using a first blade having a first thickness; and forming a second cutting region by inserting a second blade having a second thickness smaller than the first thickness into the first cutting region and by cutting the first resin layer directly below the first cutting region, to perform separation into individual light-emitting devices and to form a second inclined surface in a third lateral surface, which is a lateral surface of the first light-reflective member, in each of lateral surfaces of each of the individual light-emitting devices, such that the second inclined surface is inclined with respect to a plane of the third lateral surface and is formed adjacent to a region bonded to the wavelength conversion member.

With a light-emitting device according to certain embodiments of the present invention, when light is emitted from a light-emitting element of the light-emitting device, light transmitted through a wavelength conversion member is reflected in a direction along which light is extracted to the outside according to an inclination direction of a first inclined surface, and light emitted from the light-emitting element is scattered by light-reflective particles disposed on the first inclined surface, so that light component to be extracted to the outside can be increased. Accordingly, light extraction efficiency of the light-emitting device as a whole may thus be enhanced.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
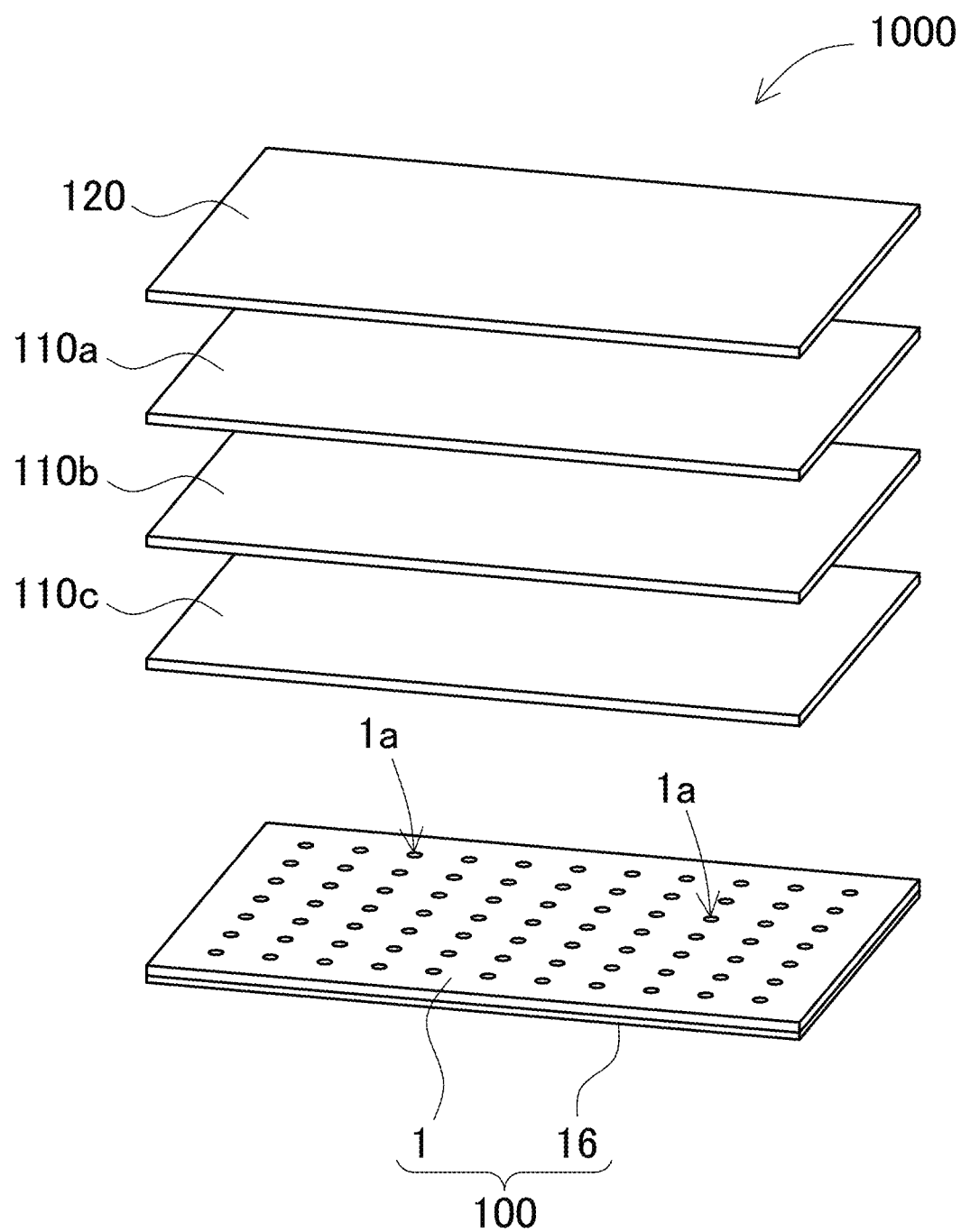
FIG. 1 is a schematic diagram showing components of a liquid-crystal display device according to a first embodiment of the present disclosure.

Certain embodiments the present invention will be described below in detail with reference to the accompanying drawings. The descriptions below include terms indicating specific directions or positions (for example, "up", "down", and other terms inclusive of these terms) as appropriate. Use of these terms is, however, intended to facilitate understanding of embodiments described above with reference to the drawings, and the meanings of these terms do not limit the technical scope of the present invention. The same reference numeral in a plurality of drawings indicates the same or similar portion or member.

Embodiments described below are intended to describe examples of a light-emitting device, a light-emitting module, and a method of manufacturing a light-emitting device in order to give a concrete form to the technical idea of the present invention, and are not intended to limit the present invention to the the embodiments described below. Unless specifically stated otherwise, description of sizes, materials, shapes, and relative positions of components described below are not intended to limit the scope of the present invention, but rather to provide examples of certain embodiments of the present invention. Descriptions in a single embodiment or example are applicable to other embodiments and examples. Sizes or positional relationships of members illustrated in the drawings may be exaggerated in order to clarify the descriptions.

First Embodiment

Liquid-crystal Display Device 1000

FIG. 1 is a schematic diagram showing the structure of a liquid-crystal display device 1000 including a light-emitting module according to a first embodiment. The liquid-crystal display device 1000 includes a liquid-crystal panel 120, two lens sheets 110a and 110b, a diffusion sheet 110c, and a light-emitting module 100 in the order from an upper side thereof. The liquid-crystal display device 1000 shown in FIG. 1 is so-called a direct-lit liquid-crystal display device in which the light-emitting module 100 is layered below the liquid-crystal panel 120. In the liquid-crystal display device 1000, the liquid-crystal panel 120 is irradiated with light emitted from the light-emitting module 100. The liquid-crystal display device 1000 may include other members such as a polarizing film and a color filter, in addition to the members described above.

Light-Emitting Module 100

Figure 2:
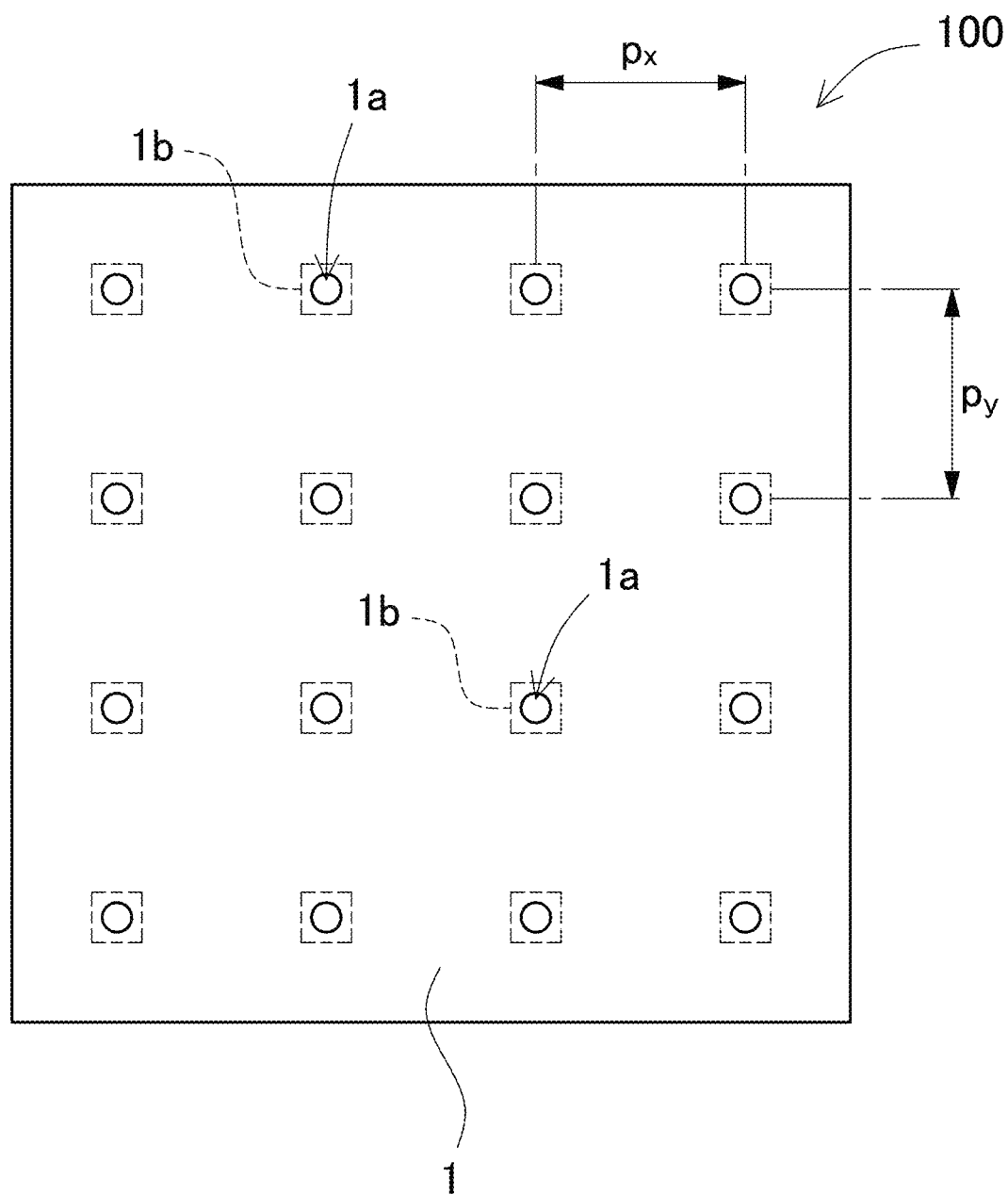
FIG. 2 is a schematic plan view of a light-emitting module according to the first embodiment of the present disclosure.
Figure 3:
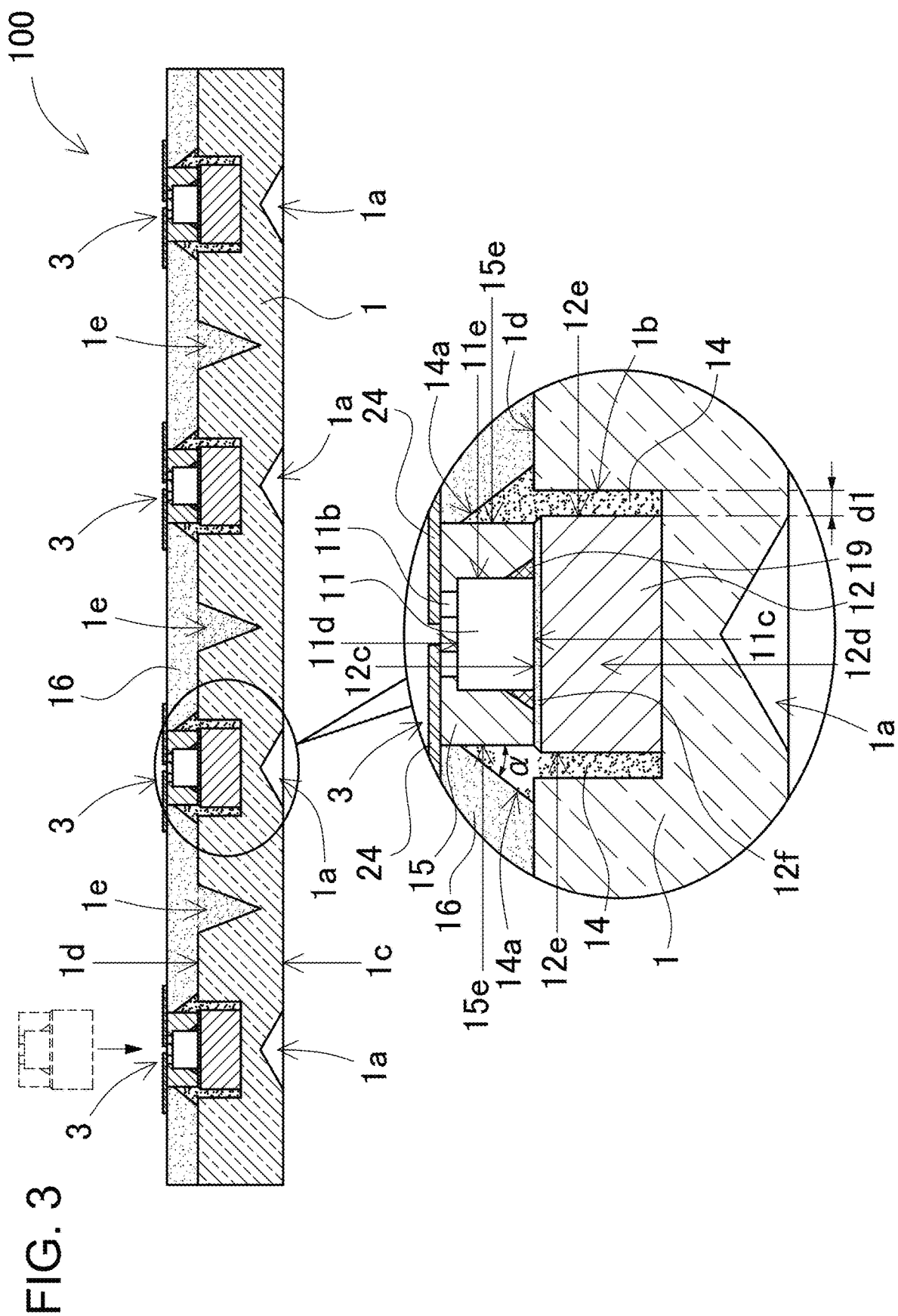
FIG. 3 is a schematic enlarged cross-sectional view of a portion of the light-emitting module according to the first embodiment of the present disclosure showing a light-guiding plate at a lower side.

FIGS. 2 and 3 show the structure of the light-emitting module 100 of the first embodiment. The light-emitting module 100 of the first embodiment is a surface-emitting module configured to emit white light. FIG. 2 is a schematic plan view of the light-emitting module according to the present embodiment. FIG. 3 is a schematic enlarged cross-sectional view of a portion of the light-emitting module according to the first embodiment. The light-emitting module 100 shown in these drawings includes light-emitting devices 3 serving as light sources, and a light-guiding plate 1 on which the light-emitting devices 3 are disposed.

Light-Guiding Plate 1

The light-guiding plate 1 has a light-guiding plate first main surface 1c (lower surface in FIG. 3) serving as a light-emitting surface through which light is emitted to the outside, and a light-guiding plate second main surface 1d (upper surface in FIG. 3) opposite to the light-guiding plate first main surface 1c. The light-guiding plate second main surface 1d of the light-guiding plate 1 has a plurality of recesses 1b spaced apart from each other, and each of the light-emitting devices 3 is to be disposed in a respective one of the plurality of recesses 1b. Grooves 1e are formed between adjacent ones of the recesses 1b. On the other hand, the light-guiding plate 1 can have, at the light-guiding plate first main surface 1c side, optical functional portions 1a that have the functions of reflecting and diffusing light emitted from the light-emitting devices 3.

The light-emitting module 100 further includes a second light-reflective member 16 covering the second main surface 1d side of the light-guiding plate 1. In addition, the light-emitting module 100 includes light-transmissive bonding members 14 each in contact with inner lateral surfaces of a respective one of the recesses 1b and outer lateral surfaces of a respective one of the light-emitting devices 3.

In the light-emitting module 100 shown in FIGS. 2 and 3, single light-guiding plate 1 has a plurality of recesses 1b, and each of the light-emitting devices 3 is disposed in a respective one of the plurality of recesses 1b. As shown in the schematic bottom view of FIG. 4, a light-emitting module 100' including rows of a plurality of light-guiding plates 1', each defining a single recess 1b in which the light-emitting device 3 is disposed, may be employed.

Light-Emitting Device 3

Figure 5:
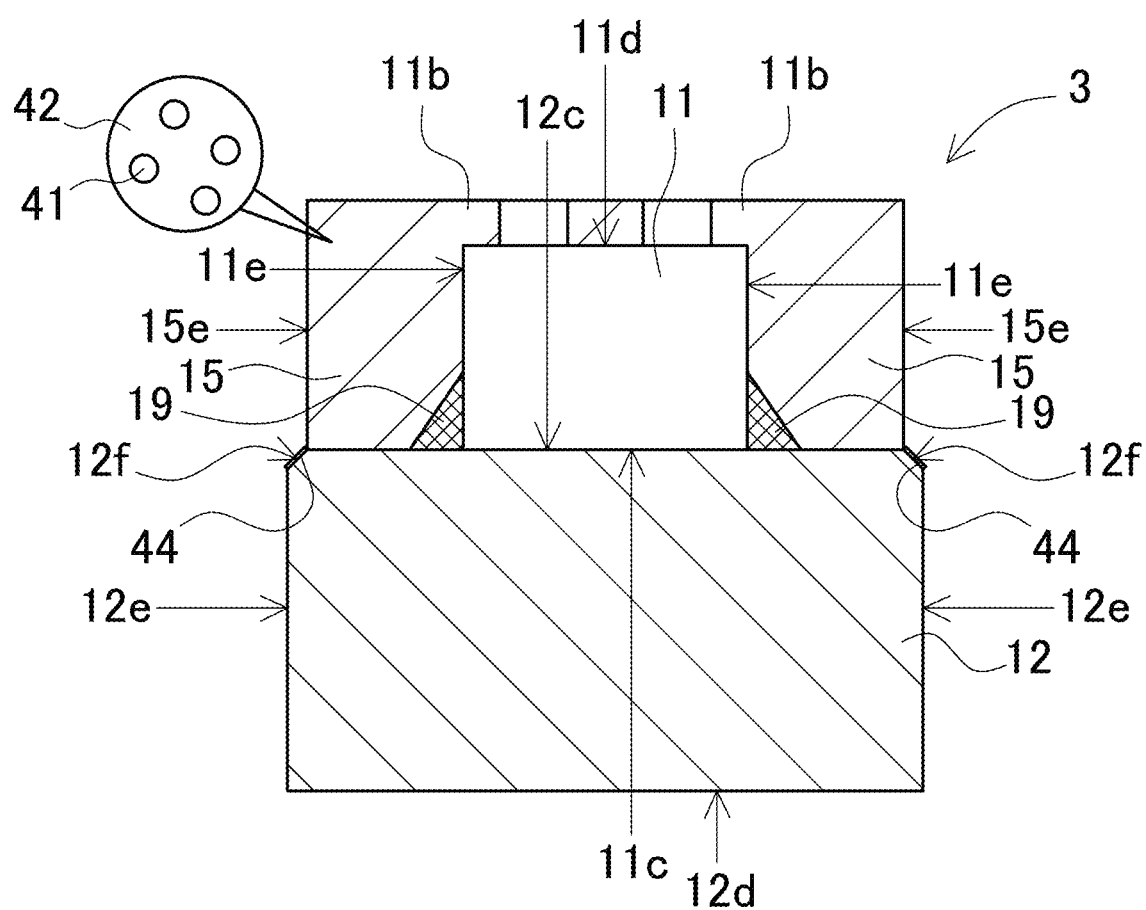
FIG. 5 is a schematic cross-sectional view of a light-emitting device according to the first embodiment of the present disclosure.

FIG. 5 is a schematic cross-sectional view of the light-emitting device 3. The light-emitting device 3 shown in FIG. 5 includes a light-emitting element 11, a wavelength conversion member 12 covering a second main surface 11c of the light-emitting element 11, a light-transmissive adhesive member 19, and a first light-reflective member 15 covering first lateral surfaces 11e of the light-emitting element 11.

In the light-emitting device 3 shown in FIG. 5, the wavelength conversion member 12 covers the second main surface 11c of the light-emitting element 11. The wavelength conversion member 12 has a third main surface 12c bonded to the second main surface 11c of the light-emitting element 11, a fourth main surface 12d, and second lateral surfaces 12e connecting the third main surface 12c and the fourth main surface 12d. The third main surface 12c has a rectangular shape with an area larger than an area of the second main surface 11c, and is bonded to the second main surface 11c. The wavelength conversion member 12 converts light emitted from the light-emitting element 11 into light with a wavelength different from a wavelength different from a wavelength of light emitted from the light-emitting element 11.

On the other hand, the light-transmissive adhesive member 19 continuously covers a portion of each of the first lateral surfaces 11e of the light-emitting element 11 at the second main surface 11c side and a portion of the third main surface 12c. Further, the first light-reflective member 15 covers the first lateral surfaces 11e of the light-emitting element 11 provided with the light-transmissive adhesive member 19. The first light-reflective member 15 further includes third lateral surfaces 15e, which are outer lateral surfaces of the first light-reflective member 15.

Light-Emitting Element 11

The light-emitting element 11 has the second main surface 11c, a first main surface 11d opposite to the second main surface 11c, and the first lateral surfaces 11e between the second main surface 11c and the first main surface 11d. The first main surface 11d is provided with a pair of positive and negative electrodes 11b. The light-emitting element 11 is configured to emit light mainly from the second main surface 11c to the wavelength conversion member 12 covering the second main surface 11c.

The light-emitting element 11 includes, for example, a light-transmissive substrate such as a sapphire substrate and a semiconductor layered structure layered on the light-transmissive substrate. The semiconductor layered structure includes a light-emitting layer and n-type and p-type semiconductor layers disposed such that the light-emitting layer is disposed between the n-type semiconductor layer and the p-type semiconductor layer. The n-type and p-type semiconductor layers are electrically connected to n-side and p-side electrodes, which are the electrodes 11b, respectively. In the light-emitting element 11, for example, the second main surface 11c provided with the light-transmissive substrate faces the light-guiding plate 1, and the first main surface 11d opposite to the second main surface 11c is provided with the pair of electrodes 11b.

The light-emitting element 11 may have any appropriate length, width, and height. For the light-emitting element 11, a semiconductor light-emitting element of preferably 1 mm or less, more preferably 0.5 mm or less, further preferably 0.25 mm or less, in length and width in a plan view is used. Using such a light-emitting element allows for providing high-definition images through local dimming of the liquid-crystal display device. Using a light-emitting element having length and width of 0.5 mm or less in a plan view allows for improving the cost efficiency of the light-emitting element and reducing the cost of the light-emitting module 100. When a length and a width of the light-emitting element in a plan view are both 0.25 mm or less, an area of the upper surface of the light-emitting element is reduced, so that the amount of emission of light from the first lateral surfaces 11e is relatively increased. In other words, light emitted from such a light-emitting element is likely to have a batwing distribution, and such a light-emitting element is therefore preferably used in the light-emitting module of the present embodiment, in which the light-emitting element is bonded to the light-guiding plate and in which the distance between the light-emitting element and the light-guiding plate is very short.

The height of the light-emitting element 11 is preferably in a range of 0.10 mm to 0.25 mm. The light-emitting element 11 preferably has such a height that the first main surface 11d of the light-emitting element 11 protrudes from the recess 1b when the light-emitting device 3 is mounted in the recess 1b of the light-guiding plate 1.

The light-emitting element 11 may have any appropriate shape, such as a square shape or an elongated-rectangular shape, in a plan view. In the case in which light-emitting elements used in a high-definition liquid-crystal display device have an elongated rectangular shape in a plan view, even if some of the light-emitting elements are disposed rotationally offset in the step of mounting the light-emitting elements, such rotational offsets can be easily detected by visual observation. Further, a p-type electrode and an n-type electrode can be spaced apart from each other, so that formation of wiring described below can be easily performed. On the other hand, in the case in which light-emitting elements each having a square shape in a plan view are used, small light-emitting elements can be mass-produced. The density (pitch) of the light-emitting elements 11 (pitch between the light-emitting elements 11), that is, distances between the light-emitting elements 11, is determined according to the intervals between the recesses 1b of the light-guiding plate 1 and can be, for example, in a range of about 0.06 mm to 20 mm, preferably about 1 mm to 10 mm. The expression "pitch between light-emitting elements 11" refers to a distance between the centers of two adjacent light-emitting elements 11. Each of the light-emitting devices 3 is designed such that each of the light-emitting elements 11 is located at a substantially center of a respective one of the light-emitting devices 3, and accordingly the pitch of the light-emitting devices 3 is also in a range of about 0.06 mm to 20 mm, preferably about 1 mm to 10 mm.

Figure 4:
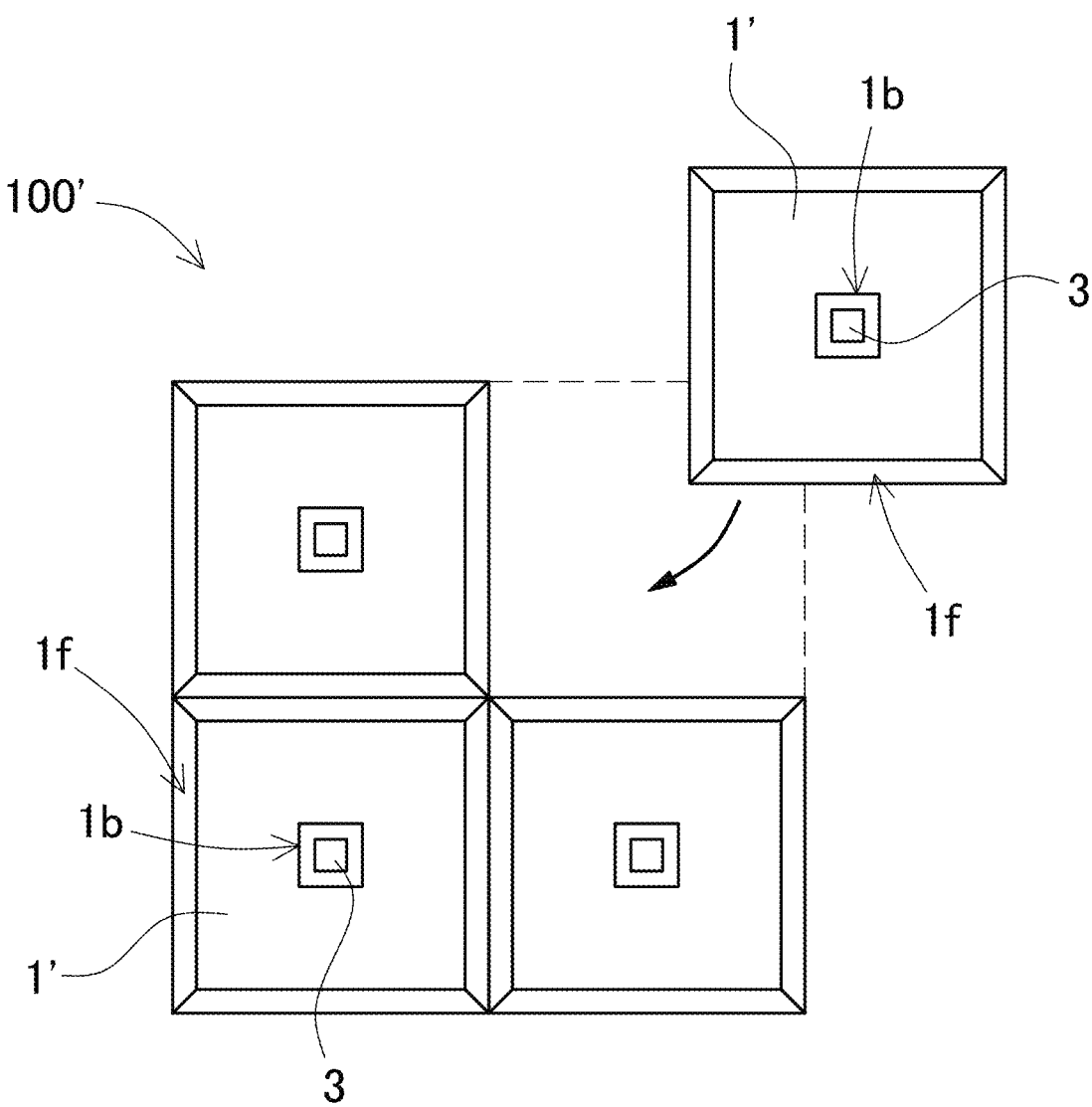
FIG. 4 is a schematic bottom view of a light-emitting module according to a modification.

Each outer lateral surface of each light-emitting device 3 is substantially parallel to a corresponding lateral surface of the corresponding recess 1b in the example shown in FIG. 4, but any other appropriate configuration can be employed. For example, the light-emitting device 3 may be rotated 45° around the center of the light-emitting device with respect to the quadrangular recess 1b.

A known semiconductor light-emitting element can be used for the light-emitting element 11. In the present embodiment, an example of using a light-emitting diode for the light-emitting element 11 will be described.

An element configured to emit light with any appropriate wavelength can be selected for the light-emitting element 11. Examples of elements configured to emit blue and green light include a light-emitting element containing a nitride semiconductor ($In_xAl_yGa_{1-x-y}N$, where $0 \le X$, $0 \le Y$, and $X+Y \le 1$) or GaP. A light-emitting element containing a semiconductor such as GaAlAs or AlInGaP can be used for an element configured to emit red light. Alternatively, semiconductor light-emitting elements made of materials other than the materials described above can be used. The emission wavelengths can be changed by changing the materials for the semiconductor layers and their mixing ratios. The composition, emission color, size, and number of the light-emitting elements to be used may be appropriately selected according to the purpose.

Wavelength Conversion Member 12

The wavelength conversion member 12 covers the second main surface 11c of the light-emitting element 11. Light emitted from the second main surface 11c is incident on the third main surface 12c of the wavelength conversion member 12. The wavelength conversion member 12 converts wavelength of the incident light, and the wavelength-converted light is emitted from the fourth main surface 12d. For example, the wavelength conversion member 12 contains a phosphor adapted to be excited by light emitted from the light-emitting element 11 and then emit light with a wavelength different from a wavelength of the excitation light. Accordingly, the component of light emitted from the light-emitting element 11 transmitted through the wavelength conversion member 12 and the component that has been subjected to wavelength conversion by the wavelength conversion member 12 are mixed, so that mixed-color light is emitted.

In the wavelength conversion member 12, a wavelength conversion substance can be dispersed in a first resin serving as a base material. The wavelength conversion member 12 may include a plurality of layers. For example, a plurality of wavelength conversion layers can constitute the wavelength conversion member. Alternatively, the wavelength conversion member may have a two-layer structure including a first layer in which a wavelength conversion substance is added to a base material and a second layer constituted of a light-diffusing member in which a diffusing material is added to a base material.

Examples of a material used for a base material of the first resin include a light-transmissive material such as epoxy resins, silicone resins, mixtures of these resins, and glass. It is effective to select a silicone resin as the first resin in view of resistance to light and ease of formation of the wavelength conversion member 12. For the base material of the wavelength conversion member 12, a material having a higher refractive index than the material of the light-guiding plate 1 is preferably used.

A phosphor can be preferably used as the wavelength conversion substance contained in the wavelength conversion member 12. Examples of the phosphor include YAG phosphors, β-SiAlON phosphors, fluoride phosphors such as KSF phosphors and MGF phosphors, and nitride phosphors. Specific examples of the composition formula include general formulae (I), (II), and (III) below.

$$A_2[M_{1-a}Mn^{4+}_aF_6] \qquad (I)$$

(In the general formula (I), the symbol "A" is at least one selected from the group consisting of $K^+$, $Li^+$, $Na^+$, $Rb^+$, $Cs^+$, and $NH^{4+}$, M is at least one element selected from the group consisting of the Group IV elements and the Group XIV elements, and "a" satisfies $0<a<0.2$.)

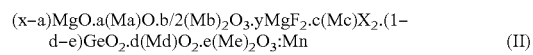

$$(x-a)MgO.a(Ma)O.b/2(Mb)_2O_3.yMgF_2.c(Mc)X_2.(1-d-e)GeO_2.d(Md)O_2.e(Me)_2O_3{:}Mn \qquad (II)$$

(In the general formula (II), Ma is at least one selected from Ca, Sr, Ba, and Zn; Mb is at least one selected from Sc, La, and Lu; Mc is at least one selected from Ca, Sr, Ba, and Zn; X is at least one selected from F and Cl; Md is at least one selected from Ti, Sn, and Zr, and Me is at least one selected from B, Al, Ga, and In. Also, x, y, a, b, c, d, and e in the general formula (II) satisfy $2 \le x \le 4$, $0<y \le 2$, $0 \le a \le 1.5$, $0 \le b<1$, $0 \le c \le 2$, $0 \le d \le 0.5$, and $0 \le e<1$.)

$$Ma_xMbyAl_3N_z{:}Eu \qquad (III)$$

(In the general formula (III), Ma is at least one element selected from the group consisting of Ca, Sr, and Ba, Mb is at least one element selected from the group consisting of Li, Na, and K, and x, y, and z respectively satisfy $0.5 \le x \le 1.5$, $0.5 \le y \le 1.2$, and $3.5 \le z \le 4.5$.)

The half band-width of a KSF phosphor represented by the general formula (I) can be 10 mm or less. The half-width of an MGF phosphor represented by the general formula (II) can be in a range of 15 mm to 35 mm. As shown in the general formula (I), a portion of Si of the composition $K_2SiF_6{:}Mn^{4+}$ of KSF phosphor may be substituted with Ti and Ge, which are other quadrivalent elements (represented by the composition formula $K_2(Si,Ti,Ge)F_6{:}Mn$); a portion of K of the composition $K_2SiF_6{:}Mn^{4+}$ of a KSF phosphor may be substituted with another alkali metal; a portion of Si of the composition $K_2SiF_6{:}Mn^{4+}$ of a KSF phosphor may be substituted with a trivalent element such as Al; or substitution of a plurality of elements may be combined.

The wavelength conversion member 12 may contain a single wavelength conversion substance or a plurality of wavelength conversion substances. In the case in which the wavelength conversion member 12 contains a plurality of wavelength conversion substances, for example, the wavelength conversion member can contain a β-SiAlON phosphor adapted to emit light of a color in the green range and a fluoride phosphor, such as a KSF phosphor, adapted to emit light of a color in the red range. This structure allows for expanding the color reproduction range of the light-emitting module 100. In this case, the light-emitting element 11 preferably contains a nitride semiconductor ($In_xAl_yGa_{1-x-y}N$, where $0 \le X$, $0 \le Y$, and $X+Y \le 1$) adapted to emit light with a short wavelength, which can efficiently excite the wavelength conversion member 12. In the case of obtaining, for example, a light-emitting module configured to emit light of a color in the red range using a light-emitting element 11 configured to emit light of a color in the blue range, the wavelength conversion member 12 may contain 60 wt % or more, preferably 90 wt % or more, of a KSF phosphor (red phosphor). That is, the wavelength conversion member 12 may contain a wavelength conversion substance adapted to emit light of a predetermined color to provide light of a predetermined color. For the wavelength conversion substance, quantum dots may be used. The wavelength conversion substance may be disposed in any appropriate configuration inside the wavelength conversion member 12. For example, the wavelength conversion substance may be substantially uniformly distributed or locally distributed. Also, a plurality of layers each containing a wavelength conversion member may be layered.

Alternatively, a member that diffuses or reflects light may be added to the wavelength conversion member 12. For example, a light-diffusing member may be mixed inside the wavelength conversion member 12, a light-diffusing plate may be applied to a surface of the wavelength conversion member 12. Alternatively, a light-diffusing member or a light-diffusing layer may be spaced apart from the wavelength conversion member 12, such that the light-diffusing member or the light-diffusing layer is mixed inside or disposed on the surface of the light-guiding plate. With a light-diffusing part, such as the light-diffusing layer or a light-diffusing region, light emitted from the light-guiding plate 1 can be more uniform. A plurality of light-diffusing parts may be disposed. For example, the light-diffusing region may include a layered structure of a plurality of light-diffusing layers.

In the light-diffusing part, a diffusing material can be added to a base material. For example, a member in which white inorganic fine particles such as $SiO_2$ or $TiO_2$ are added to a resin material serving as the base material may be used as the light-diffusing part. For the diffusing material, a white resin or fine particles of a metal, both of which are light-reflective members, can be used. With the diffusing material irregularly distributed in the base material, the diffusing material irregularly and repeatedly reflects light passing through the light-diffusing part, so that light passing through the light-diffusing part is diffused in multiple directions. This allows for reducing local concentration of irradiation light, and accordingly unevenness in luminance can be reduced.

The thickness of the wavelength conversion member 12 is preferably in a range of 0.02 mm to 0.30 mm. This range is preferable for reducing a thickness of the light-emitting module and exhibiting various effects of the wavelength conversion.

In the light-emitting device 3 shown in FIG. 5, the outer shape of the wavelength conversion member 12 is larger than the outer shape of the light-emitting element 11 in a plan view. With such a structure, in the light-emitting device 3, a greater amount of light emitted from the second main surface 11c of the light-emitting element 11 can be transmitted through the wavelength conversion member 12, and can be incident on the light-guiding plate 1, so that unevenness in emission color and luminance can be reduced.

Light-Transmissive Adhesive Member 19

As shown in FIG. 5, the light-transmissive adhesive member 19 continuously covers portions of the first lateral surfaces 11e of the light-emitting element 11 at the second main surface 11c side and a portion of the third main surface of the wavelength conversion member 12. The outer lateral surfaces of the light-transmissive adhesive member 19 are preferably inclined surfaces extending from the first lateral surfaces 11e toward the wavelength conversion member 12. The outer lateral surfaces are more preferably convex-curved surfaces protruding toward the light-emitting element 11. With this structure, a larger amount of light emitted from the first lateral surfaces 11e can be guided toward the wavelength conversion member 12, so that the light extraction efficiency can be increased.

The light-transmissive adhesive member 19 may be disposed between the second main surface 11c of the light-emitting element 11 and the wavelength conversion member 12. For example, if the light-transmissive adhesive member 19 contains a diffusing agent or the like, luminance unevenness can be reduced because light emitted from the second main surface 11c of the light-emitting element 11 is diffused in the light-transmissive adhesive member 19 before entering the wavelength conversion member 12. The same member as the bonding member 14 described below can be used for the light-transmissive adhesive member 19.

First Light-Reflective Member 15

In addition, in the light-emitting device 3, the first lateral surfaces 11e are covered with the first light-reflective member 15, with the wavelength conversion member 12 being disposed on the light-emitting element 11. More specifically, the first light-reflective member 15 covers a portion of each of the first lateral surfaces 11e that is not covered with the light-transmissive adhesive member 19 and the outer lateral surfaces of the light-transmissive adhesive member 19.

First Filler 41

The first light-reflective member 15 is made of a light-reflective material. The first light-reflective member 15 contains a light-reflective first filler 41 as shown in the schematic enlarged view of FIG. 5. The first filler 41 can be made of an inorganic material derived from metal. The first filler 41 is preferably white inorganic fine particles such as $TiO_2$. Such a first filler 41 is added to a second resin 42 serving as the base material, such as a transparent resin, so that the first light-reflective member 15 is obtained as a white resin.

In the light-emitting device 3, the first light-reflective member 15 covers surfaces of the light-emitting element 11 other than the second main surface 11c, which allows reduction of leakage of light in the directions other than the direction toward the second main surface 11c. That is, light emitted from the first lateral surfaces 11e and the first main surface 11d is reflected by the first light-reflective member 15 and is then effectively emitted to the outside through the light-guiding plate first main surface 1c of the light-guiding plate 1, which allows for increasing the light extraction efficiency of the light-emitting module 100.

For the first light-reflective member 15, a white resin having a reflectance of 60% or more, preferably 90% or more, of light emitted from the light-emitting element 11 can be suitable used. The first light-reflective member 15 is preferably a resin containing a white pigment such as white powder. A silicone resin containing white inorganic powder such as $TiO_2$ is particularly preferable for the first light-reflective member 15.

The first light-reflective member 15 is in contact with at least portions of the first lateral surfaces 11e and surrounds the light-emitting element 11, such that the light-emitting element 11 is buried in the first light-reflective member 15 while the electrodes 11b of the light-emitting element 11 are exposed at a surface of the first light-reflective member 15. In the example shown in FIG. 5, the first light-reflective member 15 is in contact with the wavelength conversion member 12. The light-transmissive adhesive member may be disposed between the first light-reflective member 15 and the wavelength conversion member 12 as described above.

First Inclined Surfaces 12f

As shown in FIG. 5, in a cross section in a direction perpendicular to the second main surface 11c, the distance between third lateral surfaces 15e at a position where the upper end of the second lateral surfaces 12e is located, at which the light-transmissive adhesive member 19 on the first lateral surfaces 11e is located, is smaller than the distance between second lateral surfaces 12e. In other words, the width of the first light-reflective member 15 is narrower than the width of the wavelength conversion member 12 at a fourth main surface side. More specifically, the second lateral surfaces of the wavelength conversion member 12 wider than the first light-reflective member 15 include first inclined surfaces 12f in a region adjacent to the third main surface 12c. The first inclined surfaces 12f are inclined from the upper ends of the second lateral surfaces 12e, that is, from the third main surface 12c. In other words, the wavelength conversion member 12 has a shape with truncated corners at a periphery of the third main surface 12c. With this structure, light entering the wavelength conversion member 12 from the light-emitting element 11 is reflected in such a direction that the light is extracted to the outside due to the inclination of the first inclined surfaces 12f, which allows for increasing the light component to be extracted to the outside, so that the light extraction efficiency of the light-emitting device as a whole can be increased.

The first inclined surfaces 12f are inclined continuously from the third lateral surfaces 15e to the second lateral surfaces 12e. It is preferable that at least portions of the first inclined surfaces 12f are curved. When the first inclined surfaces 12f are curved, the area of the first inclined surfaces 12f can be greater than in the case in which the first inclined surfaces 12f are flat. This allows for increasing the light component extracted to the outside, and the light extraction efficiency of the light-emitting device as a whole can be increased.

Light-Reflective Particles 44

In addition, light-reflective particles 44 that reflect light emitted from the light-emitting element 11 are adhered to the first inclined surfaces 12f of the wavelength conversion member 12. With this structure, the light-reflective particles 44 disposed on the first inclined surfaces 12f, in addition to the above-described first inclined surfaces 12f, scatter light emitted from the light-emitting element 11, so that the light component to be extracted to the outside can be further increased. FIG. 5 is a cross-sectional view of the light-emitting device, in which a part of the first inclined surfaces 12f is shown. When the light-emitting device has a rectangular shape when viewed from above, each of the first inclined surfaces 12f is located on a respective one of the four surfaces corresponding to the four sides of the rectangular shape when viewed from above.

The light-reflective particles 44 preferably contain the same material as a material of the first filler 41. In this example, white inorganic fine particles such as $TiO_2$ as the first filler 41 are contained in the base material such as a silicone resin. The first filler 41 is more preferably mixed in a base material that is the same as a material of the second resin 42 in the first light-reflective member 15. Accordingly, the same material can be used for the first light-reflective member 15 and the light-reflective particles 44, so that the manufacturing can be facilitated.

Figure 6:
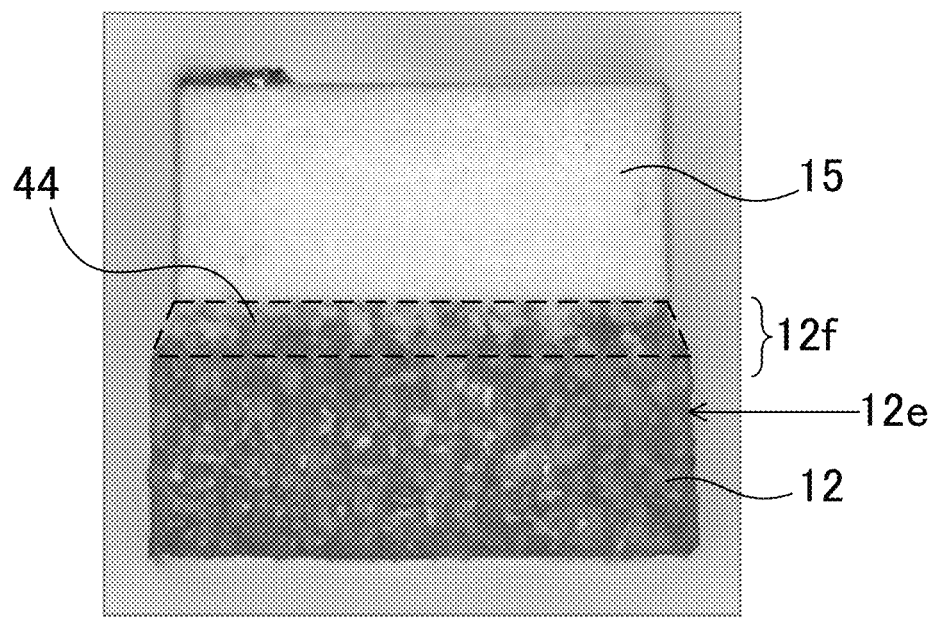
FIG. 6 is a photograph of a light-emitting device according to a modification.

The light-reflective particles 44 are preferably not adhered to the second lateral surfaces 12e of the wavelength conversion member 12. The light-reflective particles 44 may be adhered to the second lateral surfaces 12e to some degree. In this case, for example, an amount of light-reflective particles 44 adhered to the second lateral surfaces 12e is preferably smaller than an amount of light-reflective particles 44 adhered to the first inclined surfaces 12f as shown in FIG. 6. FIG. 6 is a side view of the light emitting device, in which the first inclined surface 12f is indicated by a region surrounded by a dotted line, and the light-reflective particles 44 are adhered to the region surrounded by the dotted line.

Method of Manufacturing Light-Emitting Device

Figure 7:
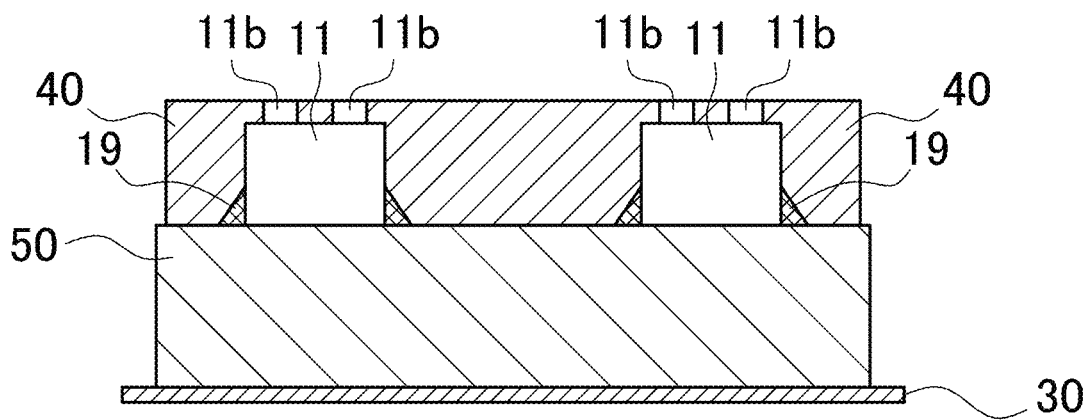
FIG. 7 is a schematic cross-sectional view for illustrating the manufacturing of the light-emitting device according to the first embodiment of the present disclosure.

Next, a method of manufacturing the light-emitting device according to the first embodiment will be described with reference to the schematic cross-sectional views of FIG. 7 to FIG. 12. A first resin layer 50, light-emitting elements 11, and a second resin layer 40 are provided as shown in FIG. 7. At this time, the first resin layer 50 is applied over a base sheet 30. For example, a tape material including an adhesive layer can be used for the base sheet 30. This structure can facilitate detachment of the wavelength conversion member 12 adhered to the base sheet 30. The first resin layer 50 contains a phosphor mixed in the first resin serving as the base material, and is cured to be the wavelength conversion member 12. A silicone resin or the like described above can be used for the first resin. A YAG-based phosphor or the like can be used for the phosphor.

After the first resin layer 50 is cured, a plurality of light-emitting elements 11 are disposed on the upper surface of the first resin layer 50 such that the plurality of light-emitting elements 11 are spaced apart from each other. The second main surface 11c side of the light-emitting element 11 is bonded and secured to the first resin layer 50 such that the first main surface 11d serves as the upper surface of the light-emitting element 11. In addition, the second resin 42 is applied between adjacent ones of the plurality of light-emitting elements 11. The light-reflective first filler 41 is mixed into the second resin 42 serving as the base material, and the second resin 42 is cured to be the first light-reflective member 15. The second resin 42 is applied with a mask being disposed to cover the electrodes 11b as appropriate, such that the electrodes 11b are exposed at the first main surface 11d from the second resin layer 40. Alternatively, the second resin layer may be formed to cover the electrodes 11b, and the electrodes 11b may be then exposed by grinding or the like. After the second resin 42 is cured as described above, an intermediate structure in which the plurality of light-emitting elements 11 and the second resin layer 40 are disposed on the first resin layer 50 is obtained as shown in FIG. 7

Figure 8:
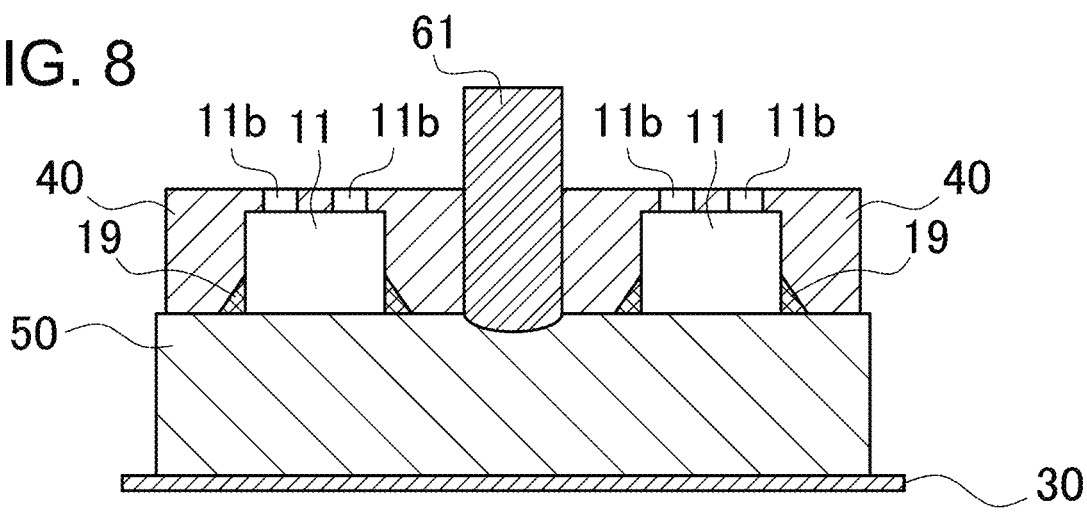
FIG. 8 is a schematic cross-sectional view for illustrating the manufacturing of the light-emitting device according to the first embodiment of the present disclosure.
Figure 9:
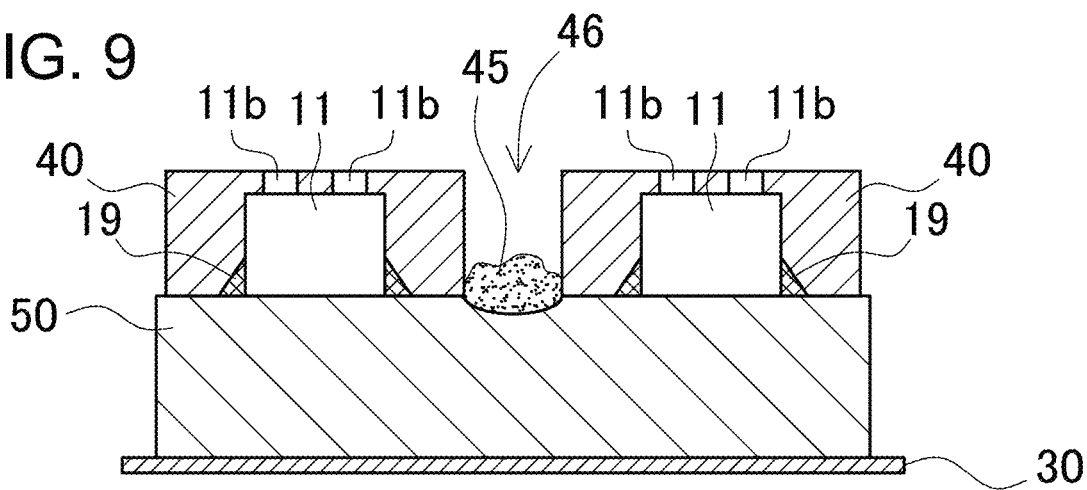
FIG. 9 is a schematic cross-sectional view for illustrating the manufacturing of the light-emitting device according to the first embodiment of the present disclosure.

Next, a first cutting region 46 is formed in the intermediate structure as shown in FIGS. 8 and 9. At this time, portions of the second resin layer 40 between adjacent ones of the plurality of light-emitting elements 11 are cut at certain intervals using a first blade 61 having a first thickness (first blade thickness). The cutting is stopped when the first resin layer 50 is exposed in the bottom of the first cutting region 46. At this time, it is preferable to perform cutting not only into the second resin layer 40 but also into a portion of the first resin layer 50. With this operation, the first resin layer 50 can be surely exposed through the second resin layer 40. For the first blade 61, for example, a hard metal saw, an electroformed blade, or a metal bond blade is used. At this time, dry cutting is performed using the first blade 61. Accordingly, swarf 45 of the first resin layer 50 is generated in the cutting. The swarf 45 is removed by suction or the like, but a predetermined amount of the swarf 45 is intentionally left in the first cutting region 46. The swarf 45 serves as the light-reflective particles 44 described below.

Figure 10:
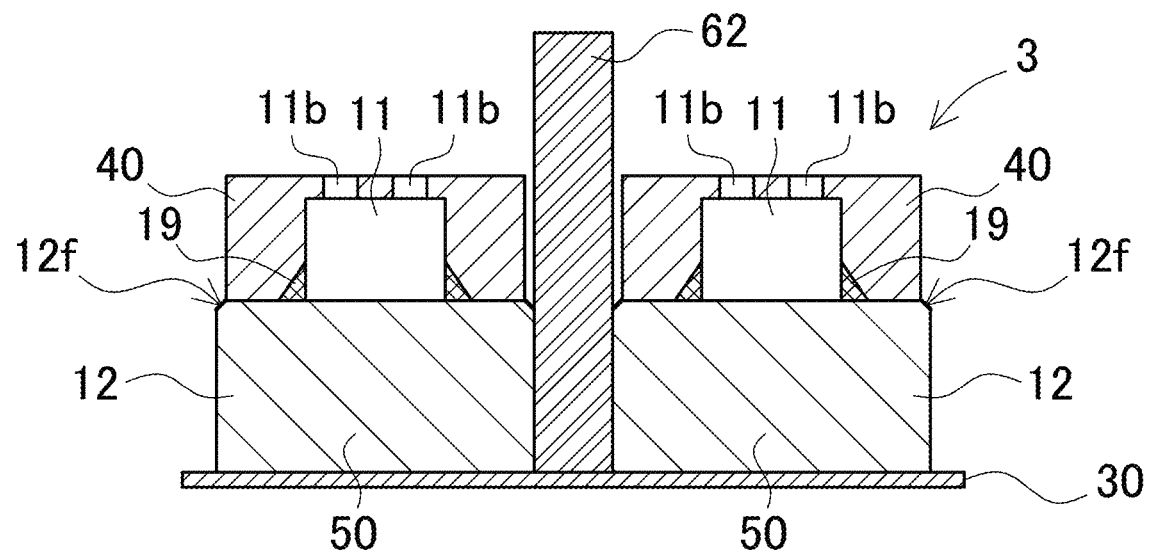
FIG. 10 is a schematic cross-sectional view for illustrating the manufacturing of the light-emitting device according to the first embodiment of the present disclosure.
Figure 11:
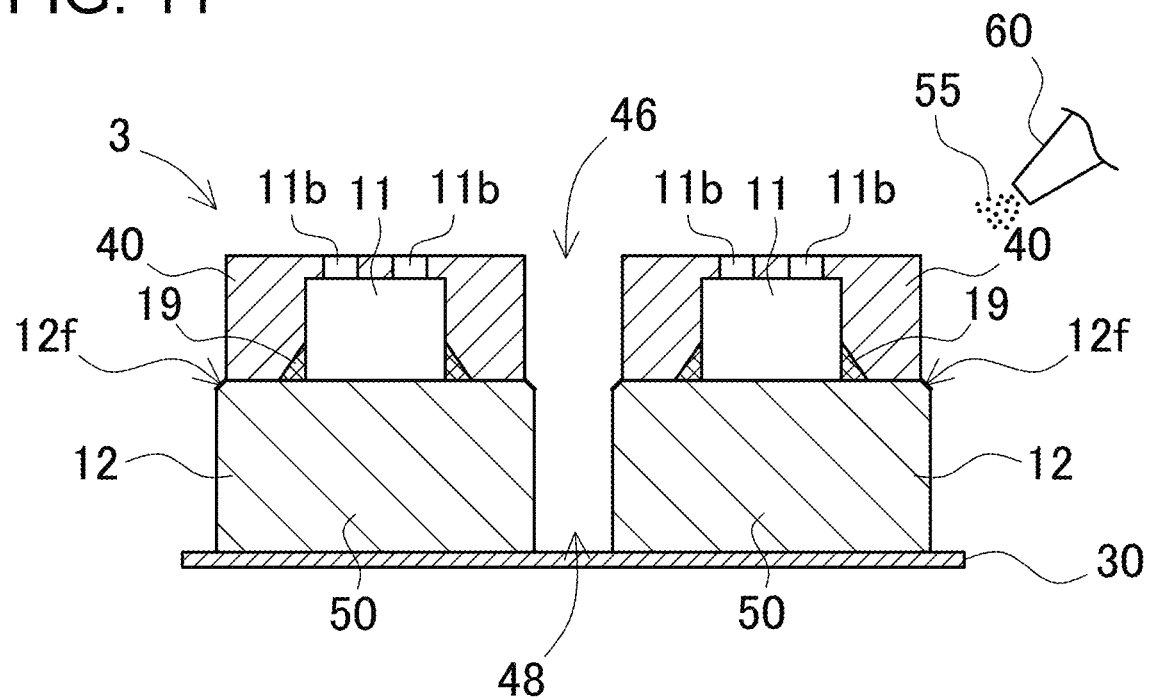
FIG. 11 is a schematic cross-sectional view for illustrating the manufacturing of the light-emitting device according to the first embodiment of the present disclosure.

Separation into individual light-emitting devices 3 is then performed as shown in FIGS. 10 and 11. At this time, the first cutting region 46 is further cut to form a second cutting region 48 as shown in FIG. 10. More specifically, a second blade 62 having a second thickness (second blade thickness) smaller than the first thickness (first blade thickness) is inserted into the first cutting region 46 to cut the first resin layer 50 in a region directly below the first cutting region 46, so that the second cutting region 48 is formed. At this time, swarf 55 of the first resin layer 50 is sucked using a suction device 60 as shown in FIG. 11. Accordingly, separation into individual light-emitting devices 3 is performed as shown in FIG. 11. At the same time, the first inclined surfaces 12f are formed at the lateral surfaces of each light-emitting device 3. In each of the second lateral surfaces 12e, a respective one of the first inclined surfaces 12f is formed near the region bonded to the first light-reflective member 15. The first inclined surfaces 12f are inclined with respect to the main planes of the second lateral surfaces 12e. Such first inclined surfaces 12f are formed at the edges of the first cutting region 46 in the cutting using the first blade 61 and/or the cutting using the second blade 62. The processing of forming the first inclined surfaces 12f may be performed using a tool other than the first blade 61 and the second blade 62 or may be performed during the processing of forming the second cutting region 48 with the second blade. This operation allows for obtaining the first inclined surfaces 12f that are inclined such that, when light is emitted from the light-emitting element of the light-emitting device, light incident on the wavelength conversion member is reflected at the first inclined surfaces 12f in a direction in which the reflected light is extracted to the outside according to the inclination directions of the first inclined surfaces.

Further, the light-reflective particles 44 are adhered to the first inclined surfaces 12f. As the light-reflective particles 44, light-reflective particles prepared separately are secured to the first inclined surfaces 12f with an adhesive material or the like, after forming the first inclined surfaces 12f. Alternatively, swarf generated by cutting to form the first cutting region 46 is adhered to the first inclined surfaces 12f at the same time as the first inclined surfaces 12f are formed. The swarf generated by cutting to form the first cutting region 46 are light-reflective particles, and accordingly the swarf, serving as the light-reflective particles 44, can be adhered to the first inclined surfaces 12f. Further, when the second blade 62 is inserted to cut the first resin layer 50 in a region directly below the first cutting region 46, the second blade 62 having the second thickness (second blade thickness) smaller than the first thickness (first blade thickness) does not hit the second resin layer 40, so that swarf made of the light-reflective particles is not generated. That is, adhering of the swarf made of the light-reflective particles to the lateral surfaces of the first resin layer 50 can be prevented or reduced when the first resin layer 50 is cut with the second blade 62. The amount of the swarf adhered to the first inclined surfaces 12f can be appropriately adjusted by adjusting the number of rotations of the blade and the strength of suction.

The required amount of the light-reflective particles 44 is secured to the first inclined surfaces 12f. For example, an adhesive material is sprayed, and the light-reflective particles 44 are secured to the first inclined surfaces 12f.

Figure 12:
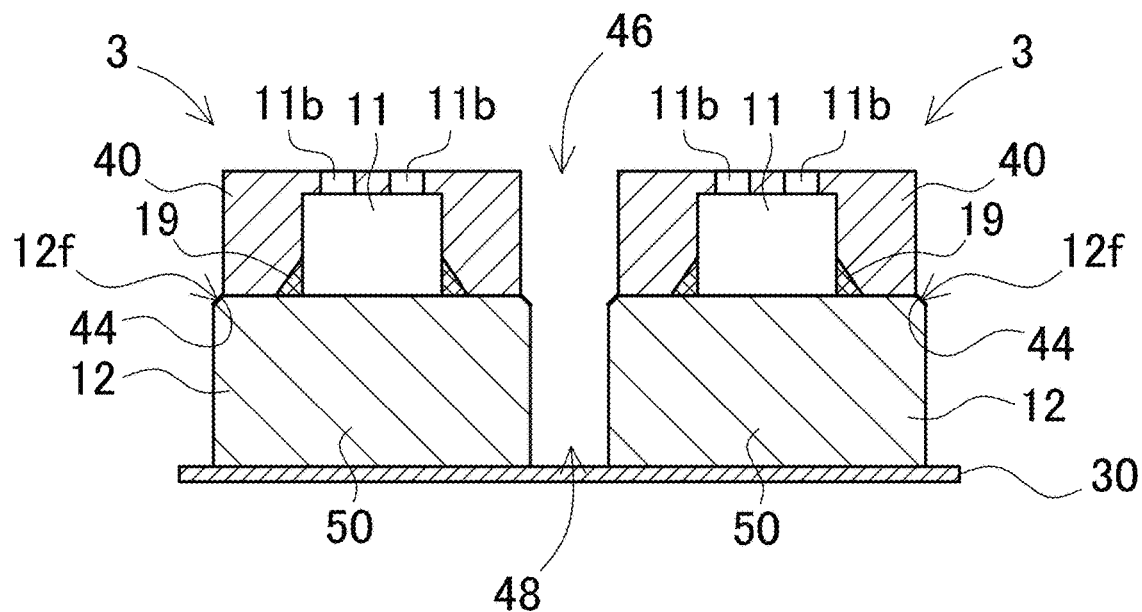
FIG. 12 is a schematic cross-sectional view for illustrating the manufacturing of the light-emitting device according to the first embodiment of the present disclosure.

Accordingly, the light-emitting devices 3 aligned on the base sheet 30 as shown in FIG. 12 are obtained. While FIGS. 7 to 12 shows the process of cutting in a direction perpendicular to the cross-section shown in each of FIGS. 7 to 12, further, similarly to this process, cutting may be further performed in a direction parallel to the cross-section shown in each of FIGS. 7 to 12. After that, each of the light-emitting devices 3 is detached from the base sheet 30 to provide the individual light-emitting device 3.

In such a light-emitting device 3, light transmitted through the wavelength conversion member 12 is reflected in a direction in which the light is extracted to the outside according to inclination directions of the first inclined surfaces 12f, and light is scattered by the light-reflective particles 44 disposed on the first inclined surfaces 12f, so that the light component extracted to the outside can be increased. The light extraction efficiency of the light-emitting device as a whole can thus be increased.

Second Embodiment

Figure 13:
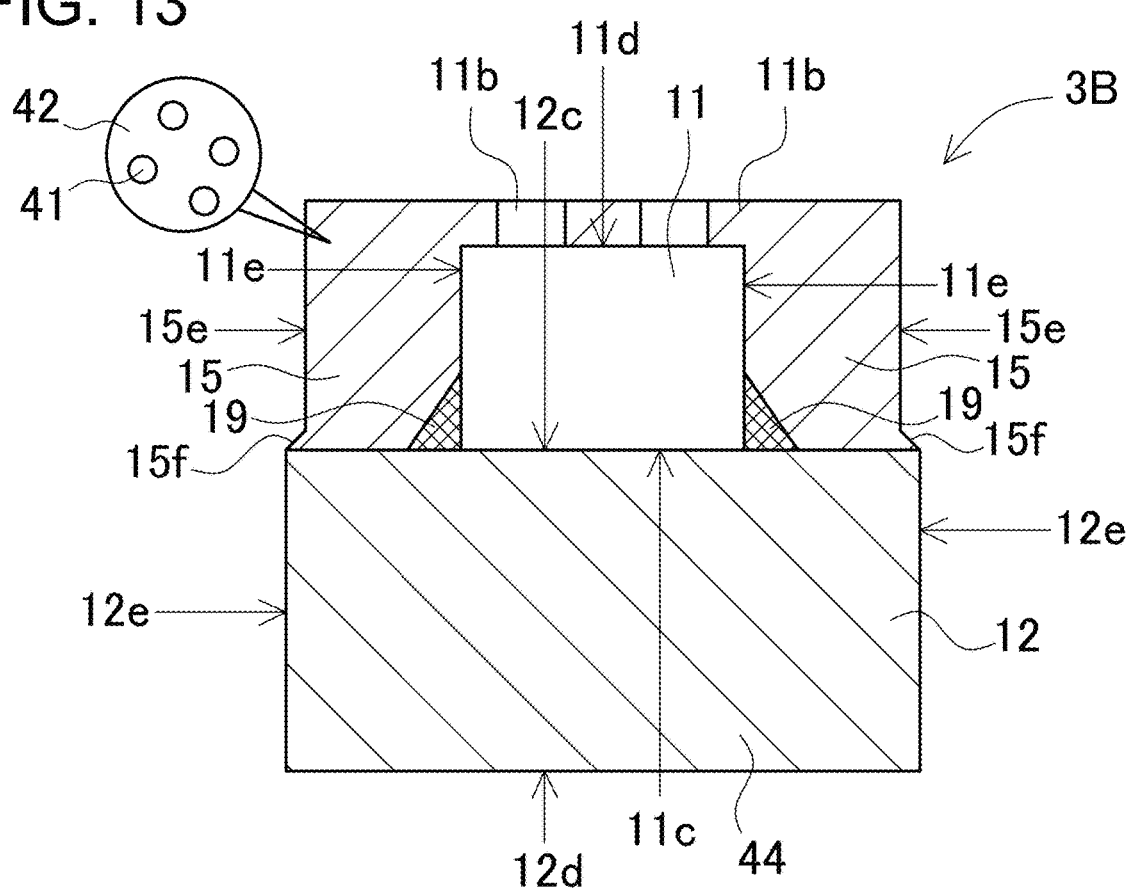
FIG. 13 is a schematic cross-sectional view of a light-emitting device according to a second embodiment of the present disclosure.

While an example in which the wavelength conversion member 12 includes the first inclined surfaces 12f is described in the example above, other configurations may be employed in the present invention. For example, instead of the inclined surfaces 12f of the wavelength conversion member 12, the first light-reflective member 15 may include inclined surfaces. An example of such a configuration is shown in the schematic cross-sectional view of FIG. 13 illustrating a light-emitting device 3B according to a second embodiment. The light-emitting device 3B shown in this drawing includes the light-emitting element 11, the wavelength conversion member 12, the light-transmissive adhesive member 19, the first light-reflective member 15, and the light-reflective particles 44. In the description below, members having the same functions as respective members described above are indicated by the same reference numerals as those in the description above, and detailed description thereof may not be repeated.

In the light-emitting device 3B shown in FIG. 13, the first light-reflective member 15 includes second inclined surfaces 15f as the inclined surfaces. The second inclined surfaces 15f are formed in a region of the third lateral surfaces 15e adjacent to the third main surface 12c. The second inclined surfaces 15f are inclined to widen from the third lateral surfaces 15e. With such a structure, the bonding area between the first light-reflective member 15 and the third main surface 12c can be increased, so that the adhesion between the first light-reflective member 15 and the wavelength conversion member 12 can be increased. Further, the effect of reflecting light entering the wavelength conversion member toward a direction in which the light is extracted to the outside can be enhanced. Still further, the region of light distribution can be adjusted by disposing the light-reflective particles 44 at the third main surface 12c side (adjacent to the second inclined surfaces 15f) of the wavelength conversion member 12.

Figure 14:
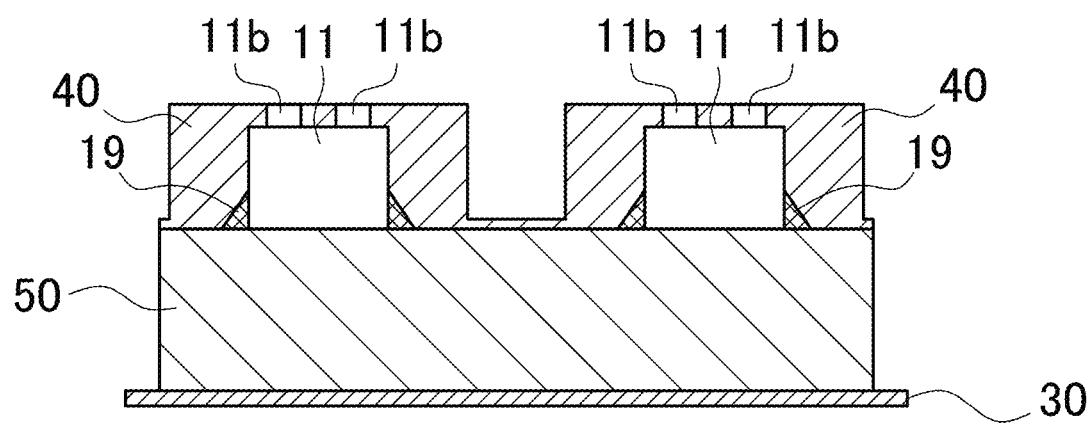
FIG. 14 is a schematic cross-sectional view for illustrating the manufacturing of the light-emitting device according to the second embodiment of the present disclosure.
Figure 15:
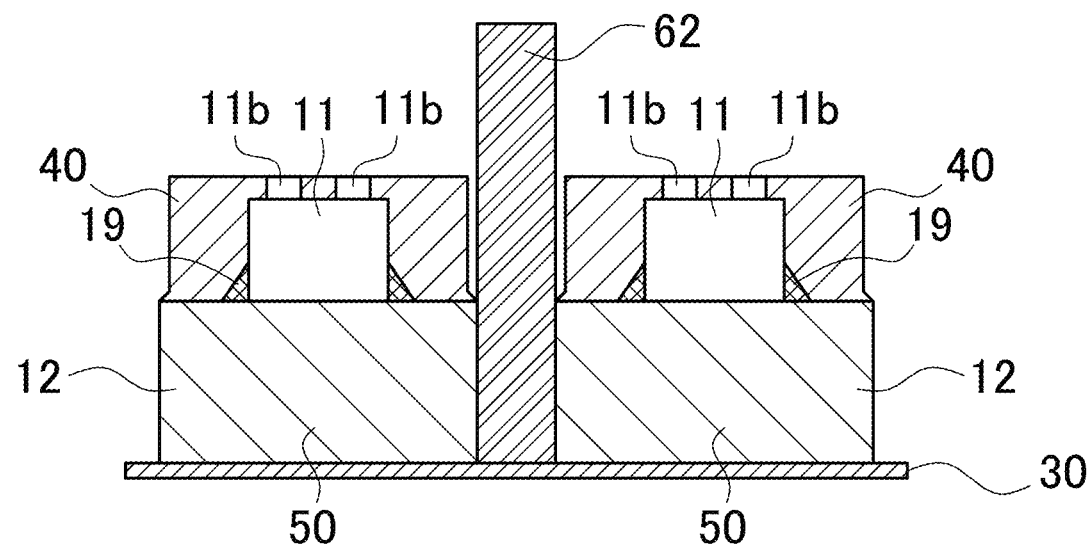
FIG. 15 is a schematic cross-sectional view for illustrating the manufacturing of the light-emitting device according to the second embodiment of the present disclosure.
Figure 16:
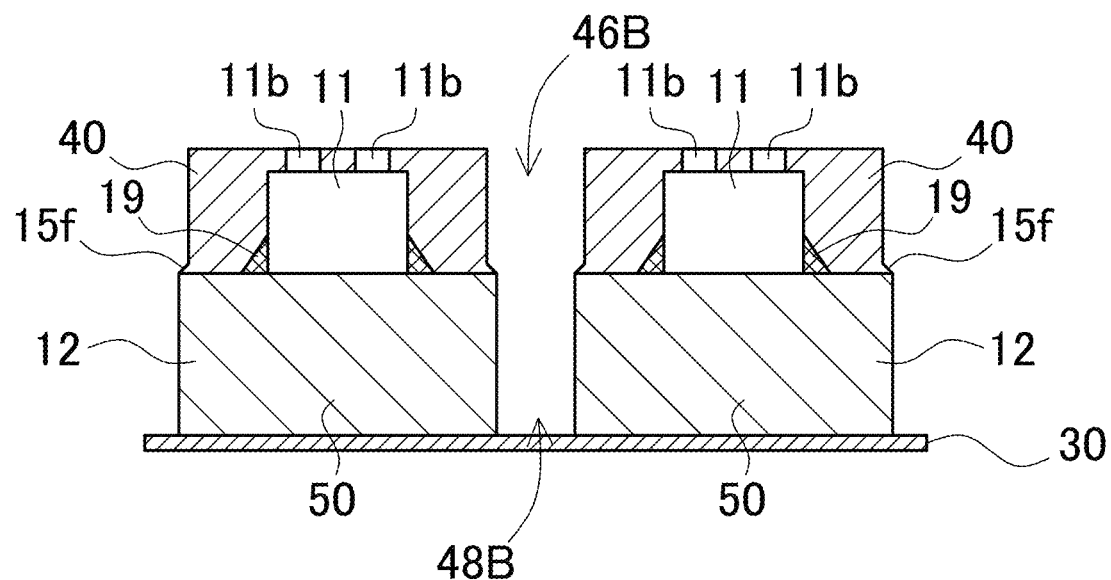
FIG. 16 is a schematic cross-sectional view for illustrating the manufacturing of the light-emitting device according to the second embodiment of the present disclosure.

A method of manufacturing the light-emitting device 3B according to the second embodiment is substantially the same as the method of manufacturing the light-emitting device 3 according to the first embodiment described above. A main difference from the first embodiment is that, in formation of a first cutting region 46B in the second resin layer 40, cutting is stopped before the tip of the first blade 61 reaches the first resin layer 50 during cutting of the second resin layer 40 with the first blade 61. With this operation, the first cutting region 46B is formed only in the second resin layer 40, and the first resin layer 50 is not exposed in the bottom of the first cutting region 46B, as shown in FIG. 14. The second blade 62 is then inserted into the first cutting region 46B as shown in FIG. 15, and a second cutting region 48B is formed as shown in FIG. 16 to separate into individual light-emitting devices 3B. The light-emitting device 3B according to the second embodiment is thus obtained.

Third Embodiment

Figure 17:
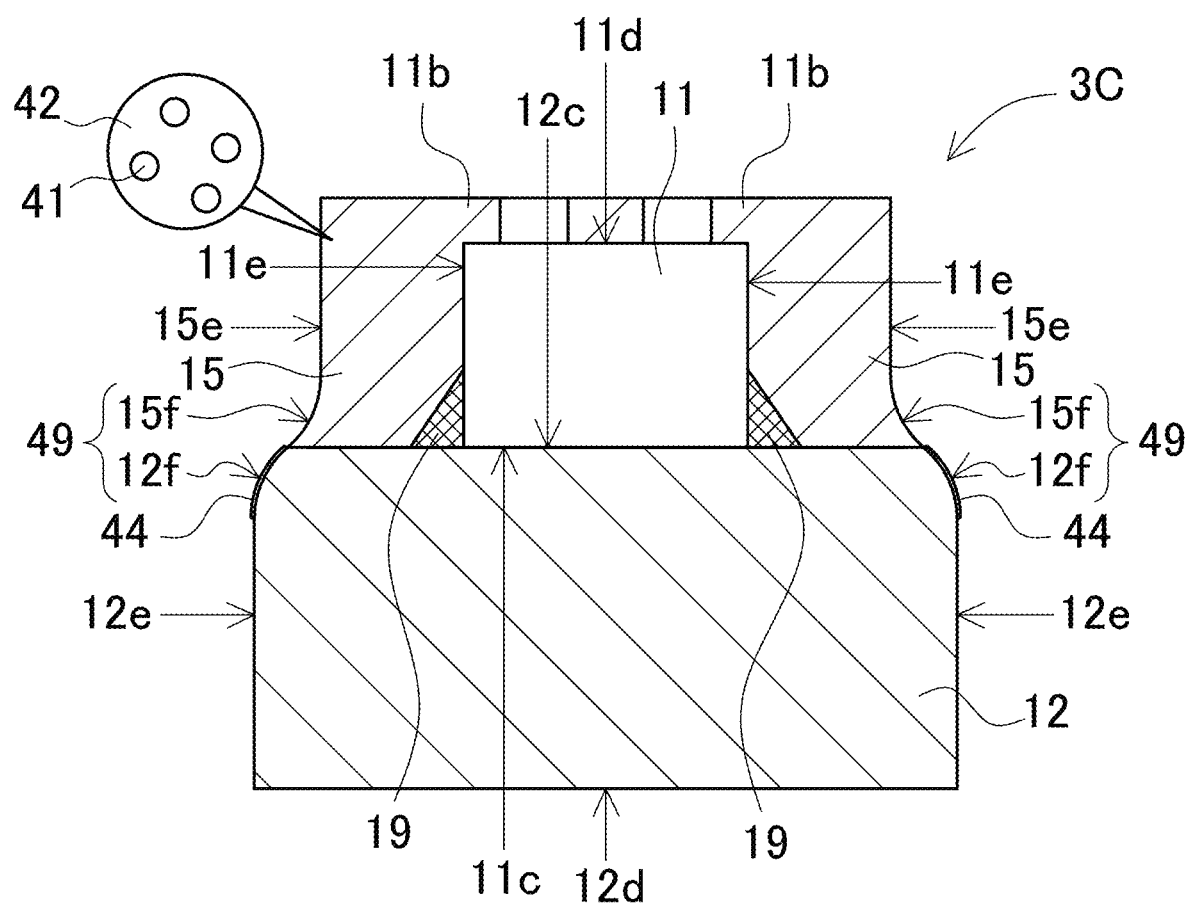
FIG. 17 is a schematic cross-sectional view of a light-emitting device according to a third embodiment of the present disclosure.

In the description above, examples in each of which the wavelength conversion member 12 or the first light-reflective member 15 includes the inclined surfaces are described. Meanwhile, other appropriate configuration may be employed in the present invention. Both the wavelength conversion member and the first light-reflective member may include respective inclined surfaces. An example of such a configuration is shown in the schematic cross-sectional view of FIG. 17 illustrating a light-emitting device 3C according to a third embodiment. The light-emitting device 3C shown in FIG. 17 has inclined surfaces 49, each of which is continuous over a first light-reflective member 15 and a wavelength conversion member 12. Each of inclined surface 49 include a second inclined surface 15$f$ of the first light-reflective member 15 and a first inclined surface 12$f$ of the wavelength conversion member 12. This structure also allows for obtaining substantially the same effects as in the first and second embodiments described above. That is, with such a structure, light introduced from the light-emitting element 11 is reflected at the first inclined surfaces 12$f$ toward the inside of the wavelength conversion member 12 to increase the component of light subjected to wavelength conversion, so that utilization efficiency of emitted light can be improved as a whole, which is an effect obtained in the first embodiment, and the bonding area between the first light-reflective member 15 and the third main surface 12$c$ can be increased, so that adhesion between the first light-reflective member 15 and the third main surface 12$c$ can be improved, which is an effect obtained in the second embodiment. Also in the present embodiment, with the light-reflective particles 44 adhered to the first inclined surfaces 12$f$ of the inclined surfaces 49, the light component extracted to the outside can be increased, as in other embodiments.

The light-emitting device, examples of which are shown in the first to third embodiments, can be used in a light-emitting module. The light-emitting module shown in FIG. 3 and other drawings using the light-emitting device 3 according to the first embodiment will be described hereinafter.

Light-Guiding Plate 1

The light-guiding plate 1 is a light-transmissive member configured to guide light emitted from the light source to provide surface emission. As shown in FIG. 3, the light-guiding plate 1 has the light-guiding plate first main surface 1$c$ serving as the light-emitting surface and the light-guiding plate second main surface 1$d$ opposite to the light-guiding plate first main surface 1$c$. The light-guiding plate second main surface 1$d$ of the light-guiding plate 1 defines a plurality of recesses 1$b$. In the present embodiment, the grooves 1$e$ are formed between adjacent ones of the plurality of recesses 1$b$.

Each of the light-emitting devices 3 is disposed in a corresponding one of the recesses 1$b$. More specifically, the light-emitting device 3 is disposed in the recess 1$b$ of the light-guiding plate 1 such that the wavelength conversion member 12 faces the bottom surface of the recess 1$b$. This structure allows reduction of the size of the light-emitting module as an entirety. In one example, as shown in FIGS. 2 and 3, a light-emitting module 100 includes the light-guiding plate 1 defining a plurality of recesses 1$b$, and the light-emitting devices 3 each disposed in a respective one of the plurality of recesses 1$b$.

Alternatively, in one example, as shown in FIG. 4, a light-emitting module 100' includes a plurality of light-guiding plates 1' two-dimensionally arranged and each having a single recess 1$b$, and light-emitting devices 3 each disposed on a respective one of the plurality of light-guiding plates 1'. The light-guiding plate 1 having a plurality of recesses 1$b$ defines the grooves 1$e$ in a lattice pattern between the recesses 1$b$ as shown in FIG. 3. The light-guiding plate 1' defining the single recess 1$b$ has inclined surfaces 1$f$, which is inclined toward the peripheral edges on the periphery of the light-guiding plate second main surface 1$d$ as shown in FIG. 4.

The second light-reflective member 16 is disposed on the surfaces of the grooves 1$e$ and the inclined surfaces 1$f$ on the periphery of the light-guiding plate second main surface 1$d$. The second light-reflective member 16, which will be described below in detail, disposed in the grooves 1$e$ is preferably a white resin that reflects light emitted from the light-emitting devices 3, which allows for reducing entry of light emitted from the light-emitting elements 11 into an adjacent section of the light-guiding plate 1 demarcated by the grooves 1$e$, so that leakage of light emitted from each light-emitting element 11 to an adjacent section can be reduced. The second light-reflective member 16 bonded to the inclined surfaces 1$f$ on the periphery of the light-guiding plate second main surface 1$d$ of single light-guiding plate 1' allows for reducing leakage of light to the surroundings of the light-guiding plate 1, so that reduction in the emission intensity from the light-guiding plate first main surface 1$c$ of the light-guiding plate 1 can be prevented.

The size of the light-guiding plate 1 is appropriately selected according to the size of the liquid-crystal display device 1000, and each side of the light-guiding plate 1 is, for example, in a range of about 1 cm to 200 cm, preferably about 3 cm to 30 cm, when the light-guiding plate 1 defines a plurality of recesses 1$b$. The light-guiding plate 1 can have a thickness in a range of about 0.1 mm to 5 mm, preferably in a range of 0.1 mm to 3 mm. The light-guiding plate 1 may have a planar shape of, for example, substantially rectangular or substantially circular.

For a material of the light-guiding plate 1, a resin material such as thermoplastic resins including acrylic resins, polycarbonates, cyclic polyolefins, poly(ethylene terephthalate), and polyesters and thermosetting resins including epoxies and silicones, or an optically transparent material such as glass can be used. In particular, thermoplastic resin materials can be efficiently manufactured using injection molding, and thus is preferably used. Among these materials, polycarbonates, which are highly transparent and inexpensive, are preferable. When a light-emitting module is manufactured without being exposed to a high-temperature environment such as solder reflow, a thermoplastic material with a low thermal resistance, such as polycarbonates, can be used for the light-emitting module.

The light-guiding plate 1 may be composed of a single layer or may be a layered structure of a plurality of light-transmissive layers. In the case in which a plurality of light-transmissive layers are layered in the light-guiding plate 1, a layer with a refractive index different from refractive indices of the plurality of light-transmissive layers, such as an air layer, is preferably disposed between appropriate layers of the plurality of light-transmissive layers. With this structure, diffusion of light is facilitated, and the light-emitting module in which unevenness in luminance is reduced can be obtained. Examples of such a structure include a structure in which a spacer is disposed between appropriate adjacent ones of light-transmissive layers to separate the appropriate adjacent light-transmissive layers such that an air layer is provided between the appropriate adjacent light-transmissive layers. Alternatively, a light-transmissive layer may be disposed on the light-guiding plate first main surface 1c of the light-guiding plate 1, and a layer with a refractive index different from a refractive index of the light-transmissive layer and a reflective index of the light-guiding plate 1, such as an air layer, may be disposed between the light-guiding plate first main surface 1c of the light-guiding plate 1 and the light-transmissive layer. With this structure, diffusion of light is facilitated, and the liquid-crystal display device in which unevenness in luminance is reduced can be obtained. Examples of such a structure include a structure in which a spacer is disposed at an appropriate location between the light-guiding plate 1 and the light-transmissive layer to separate the light-guiding plate 1 and the light-transmissive layer from each other such that an air layer is provided between the light-guiding plate 1 and the light-transmissive layer.

Recess 1b

The light-guiding plate 1 defines the recesses 1b on the light-guiding plate second main surface 1d. Each of the light-emitting devices 3 is disposed in a corresponding one of the recesses 1b such that the wavelength conversion member 12 faces the bottom surface of the recess 1b. The inner lateral surfaces of the recess 1b are located outward of the outer lateral surfaces of the light-emitting device 3 in a plan view. More specifically, the inner lateral surfaces of the recess 1b are located outside the outer lateral surfaces of the light-emitting device 3 as shown in FIG. 3.

In the light-guiding plate 1 or 1' shown in FIG. 2 to FIG. 4, the recess 1b has a quadrangular shape, and the light-emitting device 3 to be disposed in the recess 1b also has a quadrangular outer shape in a plan view. Each of the outer lateral surfaces of the quadrangular light-emitting device 3 disposed in the quadrangular recess 1b may be parallel to a corresponding one of the lateral surface of the recess 1b facing the outer lateral surface. Each of the outer lateral surfaces of the light-emitting device 3 may be rotated 45° with respect to a corresponding inner lateral surface of a corresponding recess 1b. It is more preferable that the center of the bottom surface of each of the recesses 1b substantially coincide with the center of a respective one of the light-emitting devices 3 in a plan view. This structure allows the distance from the lateral surfaces of the light-emitting device 3 to the inner lateral surfaces of the recess 1b to be constant, so that unevenness in emission color of the light-emitting module can be reduced. The light-emitting device having a quadrangular outer shape in a plan view can be disposed such that each side of the light-emitting device intersects with the corresponding side of the quadrangular recess, in other words, such that the light-emitting device is rotated with respect to the quadrangular recess.

Each recess 1b may have various sizes in a plan view, and it is preferable to have, when the recesses 1b have a circular shape, a diameter in a range of, for example, 0.05 mm to 10 mm, preferably 0.1 mm to 2 mm, when the recesses 1b have an elliptic shape, a major axis in a range of, for example, 0.05 mm to 10 mm, preferably 0.1 mm to 2 mm, when the recesses 1b have a quadrangular shape, diagonal lines with a length in a range of, for example, 0.05 mm to 10 mm, preferably 0.1 mm to 2 mm. The depth the recesses 1b can be in a range of 0.05 mm to 4 mm, preferably 0.1 mm to 1 mm. The recesses 1b can have, for example, a substantially rectangular shape or a substantially circular shape in a plan view, and the shape of the recesses 1b in a plan view can be selected according to the pitch between the recesses 1b and the like. In the case in which the pitch (distance between the centers of two adjacent recesses 1b) between the recesses 1b is substantially constant, the recesses 1b preferably has a substantially circular shape or a substantially square shape in a plan view. Among these shapes, a substantially circular shape allows light emitted from the light-emitting device 3 to spread out well.

The recess 1b more preferably has a height from the bottom surface of the recess 1b to the light-guiding plate second main surface 1d such that the second main surface 11c of the light-emitting element 11 and the light-guiding plate second main surface 1d are in the same plane in a cross-sectional view as shown in FIG. 3. The recess 1b may have a depth such that the third main surface 12c is located higher than the light-guiding plate second main surface 1d when the light-emitting device 3 is mounted in the recess 1b. With this structure, the light-emitting device 3 projects from the recess 1b, so that the wiring operation of the electrodes 11b and the like can be easily performed. The height of the recess 1b is preferably adjusted according to the height of the light-emitting device 3 as described above.

Bonding Member 14

The light-transmissive bonding member 14 is in contact with the inner lateral surfaces of the recess 1b and the outer lateral surfaces of the light-emitting device 3. In other words, the light-transmissive bonding member 14 extends from the inner lateral surfaces of the recess 1b to the third lateral surfaces of the light-emitting device 3 located outside the recess 1b. The bonding member 14 may be in contact with a portion of the first light-reflective member 15 located outside the recess 1b. In other words, the fourth main surface 12d, the second lateral surfaces 12e, and the third lateral surfaces 15e may be continuously covered by the bonding member 14. In addition, the bonding member 14 has inclined surfaces 14a, which are outer lateral surfaces inclined with respect to the third lateral surfaces 15e. Each of the inclined surfaces 14a defined an acute inclination angle α with the third lateral surface 15e. The bonding member 14 may also be disposed between the wavelength conversion member 12 and the bottom surface of the recess 1b.

When the light-emitting device 3 according to the first embodiment is secured in the recess 1b via the bonding member 14 as shown in FIG. 3, the inclined surfaces near the third main surface 12c of the light-emitting device 3 allows for obtaining the anchoring effect, which improves the adhesion.

In addition, the bonding member 14 is in contact with the light-guiding plate second main surface 1d of the light-guiding plate 1 as shown in FIG. 3. This structure increasing the area in which the inclined surfaces 14a are formed, which allows for increasing reflection of light, so that unevenness in luminance can be reduced. The inclination angle α defined by the inclined surface 14a of the bonding member 14 and the third lateral surface 15e can be in a range of 5° to 85°, preferably 5° to 50°, more preferably 10° to 45°. Various width d1 between each of the outer lateral surfaces of the light-emitting device 3 and a corresponding one of the lateral surfaces of the recess 1b can be employed according to the inner diameter of the recess 1b, the outer diameter of the light-emitting device 3, the shapes of the light-emitting device 3 and the recess 1*b*, the posture of the light-emitting device 3 mounted in the recess 1*b*, the tolerances of the mounting position of the light-emitting device 3, etc. Also, various inclination angles α can be employed according to a height of the bonding member 14, that is, a height of the light-emitting device 3 (i.e., a height of the light-emitting element 11 and a thickness of the wavelength conversion member 12), and the depth (height) of the recess 1*b*. Accordingly, the inclination angle α defined by the inclined surface 14*a* of the bonding member 14, widened toward the second main surface 1*d* of the light-guiding plate 1, and the outer lateral surface of the first light-reflective member 15 is selected according to these conditions.

As shown in FIG. 3, the bonding member 14 has the inclined surfaces 14*a* in a cross-sectional view. With this shape, light transmitted through the bonding member 14 and incident on the inclined surfaces 14*a* can be uniformly reflected toward the light-emitting surface.

A light-transmissive thermosetting resin material such as an epoxy resin or a silicone resin can be used for the bonding member 14. The light transmittance of the bonding member 14 is 60% or more, preferably 90% or more. The bonding member 14 may contain a diffusing material or the like, or may contain white powder or the like, which is a light-reflective additive. Alternatively, the bonding member 14 may be composed of only a light-transmissive resin material containing no diffusing material or white powder.

The inclined surface 14*a* of the light-transmissive bonding member 14 can be a curved surface in a cross-sectional view. For example, the inclined surface 14*a* can be a convex curved surface protruding toward the recess 1*b*. This inclined surface 14*a* allows for expanding a region to which light reflected by the inclined surface 14*a* travels, so that unevenness in luminance can be reduced.

The inclined surface 14*a* may cover the entirety of the third lateral surfaces 15*e*. In the example shown in FIG. 3 and other drawings, the inclined surface 14*a* covers a portion of the third lateral surface 15*e* other than the upper portion of the third lateral surface 15*e*, but the upper end of the inclined surface 14*a* may extend to the upper end of the first light-reflective member 15.

Optical Functional Portion 1*a*

The light-guiding plate 1 can have, at the light-guiding plate first main surface 1*c* side, the optical functional portions 1*a* that have the functions of reflecting and diffusing light emitted from the light-emitting devices 3. This light-guiding plate 1 allows light emitted from the light-emitting devices 3 to spread out in the lateral direction, and therefore the emission intensity within a plane of the light-guiding plate 1 can be uniform. The optical functional portions 1*a* can have the function of, for example, allowing light to spread out in a plane of the light-guiding plate 1. For example, each of the optical functional portions 1*a* is a circular-conical recess, a pyramidal recess such as a quadrangular-pyramidal recess or a hexagonal-pyramidal recess, a truncated-conical, or a truncated pyramidal recess formed in the light-guiding plate first main surface 1*c*. The interface between the inclined surface of the recess in the light-guiding plate 1 and a material with a refractive index different from a reflective index of the light-guiding plate (such as air) inside the optical functional portion 1*a* can reflect incident light in the lateral direction of the light-emitting device 3. For example, a light-reflective material (such as a white resin and a reflective film made of metal) may be disposed in the depression having the inclined surface. The inclined surface of the optical functional portion 1*a* may be flat or curved in a cross-sectional view.

Second Light-Reflective Member 16

As shown in FIG. 3, the second light-reflective member 16 covers the light-guiding plate second main surface 1*d* side of the light-guiding plate 1. More specifically, the second light-reflective member 16 covers the light-guiding plate second main surface 1*d* of the light-guiding plate 1, the inclined surfaces 14*a* of the light-transmissive bonding members 14, and regions of the third lateral surfaces 15*e* not covered with the bonding members 14.

The second light-reflective member 16 reflects light emitted from the light-emitting elements 11 and light entering the light-guiding plate 1 to guide the light to the light-guiding plate first main surface 1*c*, serving as the light-emitting surface from which light is emitted to the outside, which allows for increasing light extraction efficiency. With the second light-reflective member 16 layered on the light-guiding plate 1, the light-guiding plate 1 is reinforced.

A material same as a material used for the first light-reflective member 15 described above, that is, a white resin in which a light-reflective additive such as white powder is added to a transparent resin, can be preferably used for the second light-reflective member 16. With the second light-reflective member 16, light emitted from the light-emitting elements 11 is effectively emitted to the outside through the light-guiding plate first main surface 1*c* of the light-guiding plate 1.

Similarly to the first light-reflective member 15, the second light-reflective member 16 is suitably made of a white resin having a reflectance of 60% or more, preferably 90% or more, of light emitted from the light-emitting elements 11. The white resin is preferably a resin containing a white pigment such as white powder. A silicone resin containing white inorganic powder such as $TiO_2$ is particularly preferable. Using an inexpensive material such as $TiO_2$ as a material that is used in a relatively large amount to cover one surface of the light-guiding plate 1 allows the light-emitting module 100 to be inexpensive.

In the light-emitting module 100 described above, the light-guiding plate 1 defines the recesses 1*b*, and the light-emitting devices 3 are disposed in the recesses 1*b*, which allows for reducing a thickness of an entirety of the light emitting module can 100. In addition, with the light-guiding plate 1 having the recesses 1*b* in which the light-emitting devices 3 are disposed, the precision in mounting of the light-emitting devices 3 on the light-guiding plate 1 can be improved. In particular, with a structure in which the light-emitting devices 3, in each of which the light-emitting element 11 is bonded to the wavelength conversion member 12 to be integrated with the wavelength conversion member 12, are disposed in respective recesses 1*b* of the light-guiding plate 1, precision in mounting of the wavelength conversion members 12 and the light-emitting elements 11 on the light-guiding plate 1 can be improved, so that good light-emitting characteristics can be obtained. In the light-emitting module 100 in which light emitted from the light-emitting elements 11 is transmitted through the wavelength conversion members 12 to be guided to the light-guiding plate 1 and is emitted to the outside, precise arrangement of the light-emitting elements 11, the wavelength conversion members 12, and the light-guiding plate 1 allows for improving the light-emitting characteristics, such as unevenness in emission color and unevenness in luminance, of light emitted from the light-guiding plate 1 to the outside, so that particularly good light-emitting characteristics can be obtained.

With the bonding member 14 in contact with the second lateral surfaces 12e, the inner lateral surfaces of the light-guiding plate 1, and the first light-reflective member 15 located outside the recess 1b, light emitted from the wavelength conversion member 12 toward the second light-reflective member 16 can be guided lateralward of the light-emitting device 3, so that unevenness in luminance can be reduced. Light emitted from the wavelength conversion member 12 is more likely to incident on the light-guiding plate 1, so that the light extraction efficiency can be increased.

As the distance between a liquid-crystal panel and the light-emitting module is short in a direct-lit liquid-crystal display device, unevenness in emission color and unevenness in luminance of the light-emitting module may affect unevenness in emission color and unevenness in luminance of the liquid-crystal display device. Accordingly, a light-emitting module with reduced unevenness in emission color and luminance is desired to be used as a light-emitting module for a direct-lit liquid-crystal display device. With the structure of the light-emitting module 100 of the present embodiment, unevenness in luminance and emission color can be reduced while reducing a thickness of the light-emitting module 100 to be, for example 5 mm or less, 3 mm or less, and 1 mm or less.

A light-transmissive member having a function such as diffusing may be further layered on the light-guiding plate 1. In this case, when the optical functional portions 1a are recesses, the light-transmissive member is preferably disposed such that the light-transmissive member covers the opening (that is, a portion close to the light-guiding plate first main surface 1c of the light-guiding plate 1) of the recess but does not fill the recess. Accordingly, an air layer can be present in the recess of the optical functional portion 1a, which allows light emitted from the light-emitting element 11 to spread out well.

The light-emitting device, the light-emitting module, and the method of manufacturing a light-emitting device according to the present disclosure can be suitably employed for a backlight device for a television, a tablet computer, or a liquid-crystal display device, a television, a tablet computer, a smartphone, a smartwatch, a head-up display, digital signage, or a bulletin board. The light-emitting device and the light-emitting module can also be used as a light source for lighting for an emergency light, a linear lighting, various illuminations, or an instrument panel of a vehicle.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A light-emitting device comprising:
a light-emitting element including:
a first main surface provided with an electrode;
a second main surface opposite to the first main surface; and
a first lateral surface connected with the first main surface and the second main surface;
a wavelength conversion member including:
a rectangular third main surface having an area larger than an area of the second main surface and bonded to the second main surface;
a fourth main surface opposite to the third main surface; and
second lateral surfaces connected with the third main surface and the fourth main surface, the wavelength conversion member adapted to convert light emitted from the light-emitting element into light with a different wavelength;
a light-transmissive adhesive member continuously covering a portion of the first lateral surface at a second main surface side and a portion of the third main surface; and
a first light-reflective member covering the first lateral surface provided with the light-transmissive adhesive member, the first light-reflective member including third lateral surfaces that are peripheral surfaces of the first light-reflective member,
wherein the first light-reflective member contains a light-reflective first filler,
wherein, in a cross-section of the light-emitting device in a direction perpendicular to the second main surface, a distance between the third lateral surfaces of the first light-reflective member is smaller than a distance between the second lateral surfaces of the wavelength conversion member at a fourth main surface side,
wherein each of the second lateral surfaces of the wavelength conversion member includes a first inclined surface in a region adjacent to the third main surface, and
wherein the wavelength conversion member comprises light-reflective particles located on the first inclined surface.

2. The light-emitting device according to claim 1, wherein each of the third lateral surfaces of the first light-reflective member includes a second inclined surface in a region adjacent to the third main surface, and
wherein the second inclined surface is continuous with the first inclined surface.

3. The light-emitting device according to claim 2, wherein the first inclined surface is at least partially a curved surface.

4. The light-emitting device according to claim 1, wherein the light-reflective particles are made of a same material as the first filler.

5. The light-emitting device according to claim 4, wherein the first filler comprises $TiO_2$.

6. A light-emitting module comprising:
the light-emitting device according to claim 1;
a light-transmissive light-guiding plate including:
a light-guiding plate first main surface serving as a light-emitting surface for emitting light to outside; and
a light-guiding plate second main surface opposite to the light-guiding plate first main surface and defining a recess in which the light-emitting device is disposed; and
a second light-reflective member covering the light-guiding plate second main surface and the light-emitting device.

7. A light-emitting module comprising:
the light-emitting device according to claim 2;
a light-transmissive light-guiding plate including:
a light-guiding plate first main surface serving as a light-emitting surface for emitting light to outside; and
a light-guiding plate second main surface opposite to the light-guiding plate first main surface and defining a recess in which the light-emitting device is disposed; and a second light-reflective member covering the light-guiding plate second main surface and the light-emitting device.

8. A light-emitting module comprising:
the light-emitting device according to claim 3;
a light-transmissive light-guiding plate including:
   a light-guiding plate first main surface serving as a light-emitting surface for emitting light to outside; and
   a light-guiding plate second main surface opposite to the light-guiding plate first main surface and defining a recess in which the light-emitting device is disposed; and
a second light-reflective member covering the light-guiding plate second main surface and the light-emitting device.

9. A light-emitting module comprising:
the light-emitting device according to claim 4;
a light-transmissive light-guiding plate including:
   a light-guiding plate first main surface serving as a light-emitting surface for emitting light to outside; and
   a light-guiding plate second main surface opposite to the light-guiding plate first main surface and defining a recess in which the light-emitting device is disposed; and
a second light-reflective member covering the light-guiding plate second main surface and the light-emitting device.

10. A light-emitting module comprising:
the light-emitting device according to claim 5;
a light-transmissive light-guiding plate including:
   a light-guiding plate first main surface serving as a light-emitting surface for emitting light to outside; and
   a light-guiding plate second main surface opposite to the light-guiding plate first main surface and defining a recess in which the light-emitting device is disposed; and
a second light-reflective member covering the light-guiding plate second main surface and the light-emitting device.

11. The light-emitting module according to claim 6,
wherein at least a portion of the first light-reflective member is located outside the recess in a cross-sectional view,
wherein the light-emitting module further comprises a light-transmissive bonding member in contact with lateral surfaces of the recess and outer lateral surfaces of the light-emitting device, and
wherein the bonding member extends on the third lateral surfaces located outside the recess.

12. The light-emitting module according to claim 7,
wherein at least a portion of the first light-reflective member is located outside the recess in a cross-sectional view,
wherein the light-emitting module further comprises a light-transmissive bonding member in contact with lateral surfaces of the recess and outer lateral surfaces of the light-emitting device, and
wherein the bonding member extends on the third lateral surfaces located outside the recess.

13. The light-emitting module according to claim 8,
wherein at least a portion of the first light-reflective member is located outside the recess in a cross-sectional view,
wherein the light-emitting module further comprises a light-transmissive bonding member in contact with lateral surfaces of the recess and outer lateral surfaces of the light-emitting device, and
wherein the bonding member extends on the third lateral surfaces of the first light-reflective member located outside the recess.

14. The light-emitting module according to claim 9,
wherein at least a portion of the first light-reflective member is located outside the recess in a cross-sectional view,
wherein the light-emitting module further comprises a light-transmissive bonding member in contact with lateral surfaces of the recess and outer lateral surfaces of the light-emitting device, and
wherein the bonding member extends on the third lateral surfaces of the first light-reflective member located outside the recess.

15. The light-emitting module according to claim 10,
wherein at least a portion of the first light-reflective member is located outside the recess in a cross-sectional view,
wherein the light-emitting module further comprises a light-transmissive bonding member in contact with lateral surfaces of the recess and outer lateral surfaces of the light-emitting device, and
wherein the bonding member extends on the third lateral surfaces of the first light-reflective member located outside the recess.

16. A method of manufacturing a light-emitting device, the light-emitting device comprising:
   a light-emitting element;
   a wavelength conversion member;
   a light-transmissive adhesive member; and
   a first light-reflective member,
the method comprising:
   providing a first resin layer that is the wavelength conversion member, a plurality of light-emitting elements, and a second resin layer that is the first light-reflective member, such that the first resin layer contains a first resin and a phosphor mixed in the first resin, the plurality of light-emitting elements are spaced apart from each other on an upper surface of the first resin layer, and the second resin layer is disposed between adjacent ones of the plurality of light-emitting elements and contains a light-reflective first filler;
   forming a first cutting region by cutting the second resin layer at a certain interval using a first blade having a first thickness;
   forming a second cutting region by inserting a second blade having a second thickness smaller than the first thickness into the first cutting region and by cutting the first resin layer directly below the first cutting region, to perform separation into individual light-emitting devices and to form a first inclined surface in a second lateral surface, which is a lateral surface of the wavelength conversion member, in each of lateral surfaces of each of the individual light-emitting devices, such that the first inclined surface is inclined with respect to a plane of the second lateral surface and is formed adjacent to a region bonded to the first light-reflective member, and
   adhering light-reflective particles to the first inclined surface.

17. The method of manufacturing a light-emitting device according to claim 16, wherein a portion of the first resin layer is cut using a tip portion of the first blade in the step of forming a first cutting region.

18. A method of manufacturing a light-emitting device, the device comprising:
- a light-emitting element;
- a wavelength conversion member;
- a light-transmissive adhesive member; and
- a first light-reflective member, the method comprising:
- providing a first resin layer that is the wavelength conversion member, a plurality of light-emitting elements, and a second layer that is the first light-reflective member, such that the first resin layer contains a first resin and a phosphor mixed in the first resin, the plurality of light-emitting elements are spaced apart from each other on an upper surface of the first resin layer, and the second resin layer is disposed between adjacent ones of the plurality of light-emitting elements and contains a light-reflective first filler;
- forming a first cutting region by cutting the second resin layer at a certain interval using a first blade having a first thickness; and
- forming a second cutting region by inserting a second blade having a second thickness smaller than the first thickness into the first cutting region and by cutting the first resin layer directly below the first cutting region, to perform separation into individual light-emitting devices and to form a second inclined surface in a third lateral surface, which is a lateral surface of the first light-reflective member, in each of lateral surfaces of each of the individual light-emitting devices, such that the second inclined surface is inclined with respect to a plane of the third lateral surface and is formed adjacent to a region bonded to the wavelength conversion member.

19. The method of manufacturing a light-emitting device according to claim 18, wherein, in the step of forming a first cutting region, cutting is stopped before a tip portion of the first blade reaches the first resin layer.

\* \* \* \* \*